(12) United States Patent
Nomura et al.

(10) Patent No.: US 7,714,501 B2
(45) Date of Patent: May 11, 2010

(54) LIGHT EMITTING ELEMENT, LIGHT EMITTING DEVICE AND ELECTRONIC EQUIPMENT

(75) Inventors: Ryoji Nomura, Kanagawa (JP); Daisuke Kumaki, Tokyo (JP); Satoshi Seo, Kanagawa (JP); Hisao Ikeda, Kanagawa (JP); Junichiro Sakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 977 days.

(21) Appl. No.: 11/284,209

(22) Filed: Nov. 21, 2005

(65) Prior Publication Data

US 2006/0154554 A1   Jul. 13, 2006

(30) Foreign Application Priority Data

Dec. 1, 2004   (JP)   ............... 2004-348058

(51) Int. Cl.
C09K 11/06   (2006.01)
H01L 51/54   (2006.01)
H05B 33/14   (2006.01)

(52) U.S. Cl. .................. 313/504; 313/506; 257/40; 257/E51.047; 428/690; 428/917

(58) Field of Classification Search ............. 546/56, 546/58
See application file for complete search history.

(56) References Cited

U.S. PATENT DOCUMENTS 5,393,614 A * 2/1995 Nakada ............... 428/690

(Continued)

FOREIGN PATENT DOCUMENTS

JP   09-063771   3/1997

(Continued)

OTHER PUBLICATIONS

Liu et al., Synthetic Metals, (2002), vol. 128, pp. 211-214.*

(Continued)

*Primary Examiner*—D. Lawrence Tarazano
*Assistant Examiner*—Brett A Crouse
(74) *Attorney, Agent, or Firm*—Cook Alex Ltd.

(57) ABSTRACT

It is an object of the present invention to provide a light emitting element which can reduce defective operation due to crystallization of a compound. One of the light emitting elements of the present invention has a layer, which generates electrons, between a first electrode and a second electrode. The layer generating electrons includes a phenanthroline derivative represented by the general formula (1) and a metal oxide. The metal oxide shows an electron donating property to the phenanthroline derivative represented by the general formula (1). Herein, in the general formula (1), $R^1$ to $R^5$ individually represents an alkyl group having 1 to 4 carbon atoms or a halogen group, and further at least one of $R^1$ to $R^5$ represents a halogen group.

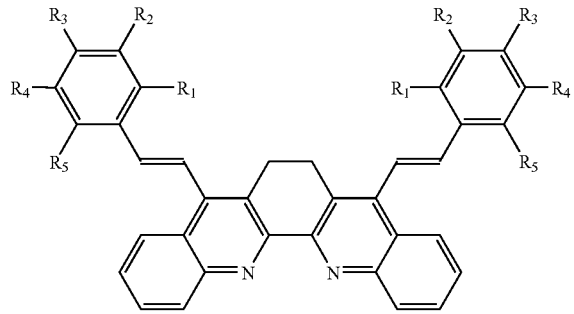

19 Claims, 14 Drawing Sheets

U.S. PATENT DOCUMENTS

| | | | |
|---|---|---|---|
| 6,013,384 A | 1/2000 | Kido et al. | 428/690 |
| 2002/0055015 A1* | 5/2002 | Sato et al. | 428/690 |
| 2003/0189401 A1 | 10/2003 | Kido et al. | 313/504 |
| 2004/0146746 A1* | 7/2004 | Lee et al. | 428/690 |
| 2006/0008740 A1 | 1/2006 | Kido et al. | |
| 2007/0114512 A1 | 5/2007 | Kumaki et al. | |
| 2007/0145353 A1 | 6/2007 | Nomura et al. | |
| 2007/0200125 A1 | 8/2007 | Ikeda et al. | |

FOREIGN PATENT DOCUMENTS

| | | |
|---|---|---|
| JP | 10-270172 | 10/1998 |
| JP | 11-307264 | 11/1999 |
| JP | 2003-272860 | 9/2003 |

OTHER PUBLICATIONS

Reinig, J., Fabrication of Organic Light-Emitting Devices, (2001).*

* cited by examiner

LIGHT EMITTING ELEMENT, LIGHT EMITTING DEVICE AND ELECTRONIC EQUIPMENT

FIELD OF THE INVENTION

The present invention relates to a light emitting element having a layer including a light emitting substance between a pair of electrodes, and a light emitting device and electronic equipment using it.

BACKGROUND OF THE INVENTION

A light emitting element having a layer including a light emitting substance between a pair of electrodes is used as a pixel, a light source or the like, and provided in a light emitting device such as a display device and a lighting device. In such light emitting devices, the reliability of a light emitting element is closely related to the capability of a light emitting device. For example, in a case where short-circuiting is generated between electrodes of a light emitting element, display image is distorted or a sufficient amount of light cannot be emitted.

Therefore, development of a light emitting element which has few defective elements and can emit stably for a long period has recently advanced. For example, in Patent Document 1, a technique of manufacturing a light emitting element which works at a low driving voltage by using a metal oxide whose work function is high, such as molybdenum oxide, as an anode, is disclosed. In addition, an effect of extending its life time is obtained.

[Patent Document 1] Japanese Patent Publication No. Hei 9-63771

It is an object of the present invention to provide a light emitting element which can reduce a defective operation due to crystallization of a compound.

SUMMARY OF THE INVENTION

A phenanthroline derivative which is used in implementing the present invention is represented by the following general formula (1).

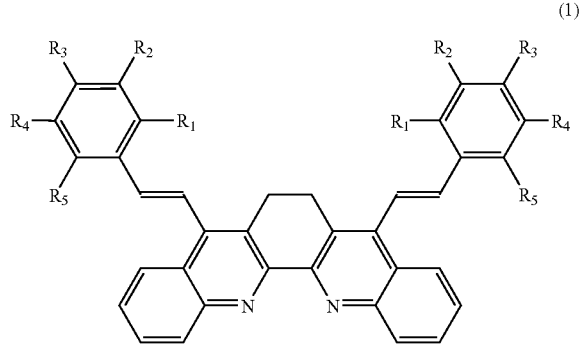

(1)

In the general formula (1), $R^1$ to $R^5$ individually represents an alkyl group having 1 to 4 carbon atoms or a halogen group, and further, at least one of $R^1$ to $R^5$ represents a halogen group.

One of the present inventions is a light emitting element having a layer which generates electrons between a first electrode and a second electrode. The layer which generates electrons includes the phenanthroline derivative represented by the general formula (1) and a metal oxide. The metal oxide shows an electron donating property to the phenanthroline derivative represented by the general formula (1).

One of the present inventions is a light emitting element having a layer which generates electrons between a first electrode and a second electrode, and a layer including a light emitting substance. Herein, the layer which generates electrons includes the phenanthroline derivative represented by the general formula (1) and a metal oxide. The metal oxide shows an electron donating property to the phenanthroline derivative represented by the general formula (1). The layer including the light emitting substance may be a single layer or multilayer. In the case of the multilayer, a light emitting substance may be included in at least one layer.

One of the present inventions is a light emitting element having a layer which generates holes between the first electrode and the second electrode, a layer including a light emitting substance, and a layer which generates electrons. The layer which generates holes is provided between a layer including a light emitting substance and the first electrode. The layer which generates electrons is provided between the layer including a light emitting substance and the second electrode. Herein, the layer which generates electrons includes the phenanthroline derivative represented by the general formula (1) and a metal oxide. The metal oxide shows an electron donating property to the phenanthroline derivative represented by the general formula (1). The layer including a light emitting substance may be a single layer or multilayer. In the case of the multilayer, a light emitting substance may be included in at least one layer.

One of the present inventions is a light emitting element having a first layer, a second layer, and a third layer between the first electrode and the second electrode. The first layer generates holes, and the second layer generates electrons. In addition, the third layer includes a light emitting substance. The first layer is provided more closely to the first electrode side than the second layer, and the third layer is provided more closely to the second electrode side than the second layer. The second layer includes the phenanthroline derivative represented by the general formula (1) and the metal oxide. The metal oxide shows an electron donating property to the phenanthroline derivative represented by the general formula (1). In addition, the second layer and the third layer are connected so that electrons are injected from the second layer to the third layer when voltage is applied so that electric potential of the first electrode is lower than that of the second electrode. The layer including a light emitting substance may be a single layer or multilayer. In the case of the multilayer, a light emitting substance may be included in at least one layer.

One of the present inventions is a light emitting device using any one of the above-mentioned light emitting element as a pixel or a light source.

One of the present inventions is electronic equipment having a light emitting device, for a display portion, in which any one of the above-mentioned light emitting element is used as a pixel.

One of the present inventions is electronic equipment having a light emitting device, for a lighting portion, in which any one of the above-mentioned light emitting element is used as a light source.

Since a phenanthroline derivative used in implementing the present invention easily accepts electrons, a light emitting element which easily generates electrons and supplies stably the electrons to a light emitting layer can be obtained by carrying out the present invention. By carrying out the present invention, conductivity is improved compared with a layer containing only the phenanthroline derivative, and a light emitting element which has little changes of a driving voltage due to increase of the film-thickness, can be obtained. In addition, since a layer, which is used in implementing the present invention, in which the phenanthroline derivative and a metal oxide are mixed is difficult to be crystallized, a light emitting element which has few defective operations due to crystallization of an electron generating layer can be obtained by carrying out the present invention.

Since the light emitting element used in implementing the present invention has few defective operations due to crystallization, a light emitting device which has few defective displays or the like due to a defect in a light emitting element can be obtained by carrying out the present invention.

The light emitting device used in implementing the present invention has few defective displays or the like, since it employs the light emitting element which has few defective operations due to crystallization. Therefore, electronic equipment which can transmit correct information through a display image to a user with little false recognition in image due to a defective display in a light emitting device can be obtained by carrying out the present invention.

DETAILED DESCRIPTION OF THE PRESENTLY PREFERRED EMBODIMENTS

Hereinafter, one mode of the present invention is shown. Note that the present invention can be carried out in many different modes, and it is easily understood by those skilled in the art that various modifications in its modes and details are possible, unless they depart from the content and the scope of the present invention. Therefore, it should not be interpreted with limitation on the description in these present embodiment modes.

Embodiment Mode 1

Figure 1:
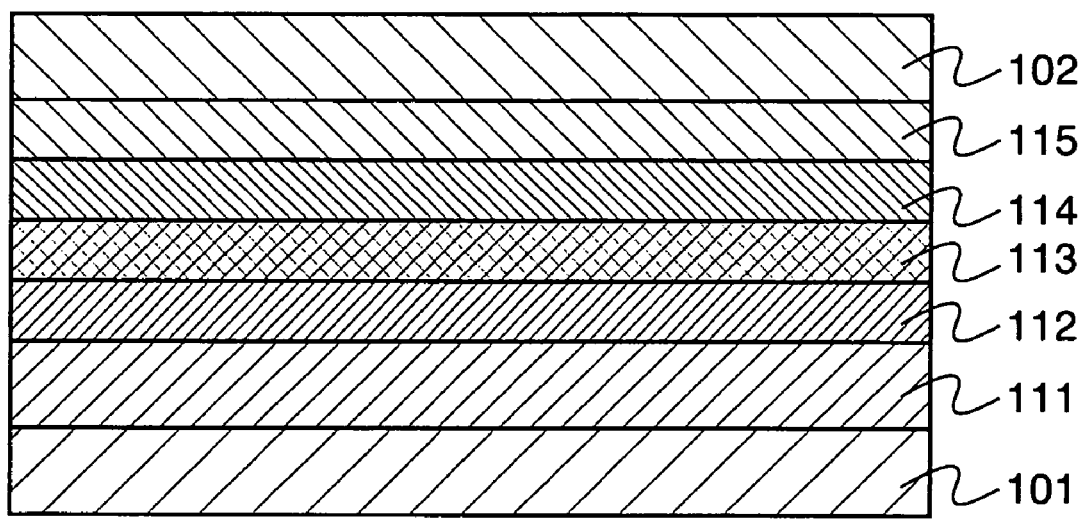
FIG. 1 is a diagram showing one mode of a light emitting element of the present invention.

One mode of a light emitting element according to the present invention is described referring to FIG. 1.

In FIG. 1, a light emitting element having a hole generating layer 111 between a first electrode 101 and a second electrode 102 is shown. Between the hole generating layer 111 and the second electrode 102, a hole transporting layer 112, a light emitting layer 113, an electron transporting layer 114 and an electron generating layer 115 are provided. When voltage is applied to the first electrode 101 and the second electrode 102 so that electric potential of the first electrode 101 is higher than that of the second electrode 102, holes are injected from the side of the first electrode 101, and electrons are injected from the side of the second electrode 102 to the light emitting layer 113. Then, the holes and electrons which are injected to the light emitting layer 113 are recombined. A light emitting substance is included in the light emitting layer 113, and the light emitting substance becomes excited by excitation energy which is generated in recombination. The light emitting substance which becomes excited emits light when it returns to ground state.

The electron generating layer 115 is a layer for generating electrons and made by mixing the phenanthroline derivative represented by the general formula (1) and a substance showing an electron donating property to the phenanthroline derivative represented by the general formula (1). In the electron generating layer 115 having such a structure, the phenanthroline derivative represented by the general formula (1) accepts electrons from the substance showing an electron donating property. In other words, the phenanthroline derivative represented by the general formula (1) is reduced, and electrons are generated.

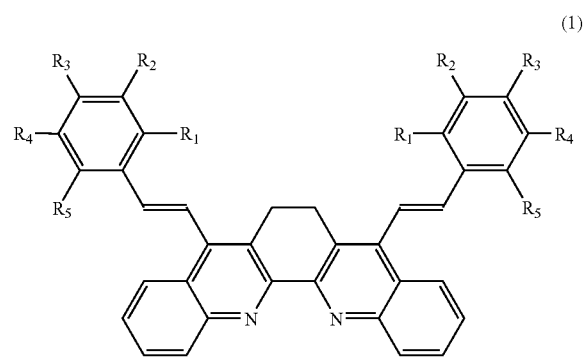

(1)

In the general formula (1), $R^1$ to $R^5$ individually represents an alkyl group having 1 to 4 carbon atoms or a halogen group such as fluorine, chlorine, iodine, and bromine, and further at least one of $R^1$ to $R^5$ represents a halogen group.

The phenanthroline derivative represented by the general formula (1) easily accepts electrons, since it has a halogen element such as fluorine as a substituent. Thus, by using the phenanthroline derivative represented by the general formula (1), electrons are easily generated and electrons are stably supplied to a light emitting layer. In addition, by mixing the phenanthroline derivative and a substance showing an electron donating property to the phenanthroline derivative, conductivity is enhanced, compared with a layer including only the phenanthroline derivative. Therefore, it is easy to adjust a light path length or reduce unevenness of the surface of the electrode by making the electron generating layer 115 thick. Note that the electron generating layer 115 made by mixing the phenanthroline derivative and a substance showing an electron donating property to the phenanthroline derivative is difficult to be crystallized, and thus it is difficult to generate defective elements due to crystallization.

Note that it is preferable to use a phenanthroline derivative having an electron mobility of $1 \times 10^{-6}$ cm$^2$/Vs particularly among the phenanthroline derivative represented by the general formula (1). In addition, as the substance showing an electron donating property to the phenanthroline derivative represented by the general formula (1), a substance selected from an alkali metal and an alkali earth metal, concretely, such as lithium (Li), calcium (Ca), sodium (Na), potassium (K), or magnesium (Mg), can be used. In addition, at least one of the substances selected from an alkali metal oxide, an alkali earth metal oxide, an alkali metal fluoride, an alkali earth metal fluoride or the like, concretely, a lithium oxide (Li$_2$O), a calcium oxide (CaO), a sodium oxide (Na$_2$O), a potassium oxide (K$_2$O), a magnesium oxide (MgO), a lithium fluoride (LiF), a cesium fluoride (CsF), a calcium fluoride (CaF$_2$) or the like can be used as a substance showing an electron donating property. By combining those metal oxide and metal fluoride, crystallization of the electron generating layer 115 can be suppressed and defective operation of an element due to crystallization can be reduced. Note that a metal oxide and a metal fluoride such as an alkali metal oxide, an alkali earth metal oxide, an alkali metal fluoride, or an alkali earth metal fluoride are preferable, since they have a low reactivity and they are easy to treat.

The hole generating layer 111 is a layer for generating holes, which is formed by mixing at least one substance selected from a substance having a high hole transporting property and a bipolar substance, and a substance showing an electron accepting property to those substance. Herein, a substance having a hole mobility equal to or higher than $1 \times 10^{-6}$ cm$^2$/Vs is particularly preferable among the substances having a high hole transporting property and the bipolar substance. Note that the substance having a high hole transporting property is a substance in which a hole mobility is higher than an electron and the rate value of a hole mobility to an electron mobility (=hole mobility/electron mobility) is higher than 100. As a concrete example for a substance having a high hole transporting property, 4,4'-bis[N-(1-naphthyl)-N-phenylamino]biphenyl (abbreviation: NPB); 4,4'-bis[N-(3-methylphenyl]-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris[N,N-di(m-tolyl)amino]benzene (abbreviation: m-MTDAB); 4,4',4''-tris(N-carbazolyl)triphenylamine (abbreviation: TCTA); phthalocyanine (abbreviation: H$_2$Pc); copper phthalocyanine (abbreviation: CuPc); vanadyl phthalocyanine (abbreviation: VOPc) and the like can be given. Note that the bipolar substance is a substance in which the rate value of a mobility of one carrier to that of a mobility of the other carrier is equal to or less than 100, preferably equal to or less than 10, when a mobility of a carrier of either of an electron or a hole is compared with that of a carrier of the other one. As the bipolar substance, for example, 2,3-bis(4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like can be given. As for a substance showing an electron accepting property, there is no limitation; however, it is preferable to use a metal oxide such as a molybdenum oxide, a vanadium oxide, a ruthenium oxide, or a rhenium oxide. Note that, besides those, a metal oxide such as a titanium oxide, a chromium oxide, a zirconium oxide, a hafnium oxide, a tantalum oxide, a tungsten oxide, or a silver oxide may also be used.

Note that the light emitting layer 113 includes a light emitting substance. Herein, the light emitting substance is a substance which has a favorable light emitting efficiency and can emit light having a desirable wavelength. The light emitting layer 113 may be a layer formed with only a light emitting substance; however, a layer in which a light emitting substance is mixed to be diffused in a layer including a substance having a larger energy gap than the energy gap of the light emitting substance is preferable, in a case where concentration quenching is generated. By including a light emitting substance in the light emitting layer 113 to be diffused, quenching due to concentration can be prevented. Herein, the energy gap means an energy gap between LUMO level and HOMO level.

There is no particular limitation on a light emitting substance, and a substance which has a favorable light emitting efficiency and can emit light having a desirable light emitting wavelength, may be used. For example, when reddish light-emission is needed to be obtained, a substance that can emit light with a peak of emission spectrum in 600 to 680 nm can be used as a light emitting substance, such as 4-dicyanomethylene-2-isopropyl-6-[2-(1,1,7,7-tetramethyljulolidine-9-yl)ethenyl]-4H-pyran (abbreviation: DCJTI); 4-dicyanomethylene-2-methyl-6-[2-(1,1,7,7-tetramethyljulolidine-9-yl)ethenyl]-4H-pyran (abbreviation: DCJT); 4-dicyanomethylene-2-tert-butyl-6-[2-(1,1,7,7-tetramethyljulolidine-9-yl)ethenyl]-4H-pyran (abbreviation: DCJTB); periflanthene; or 2,5-dicyano-1,4-bis[2-(10-methoxy-1,1,7,7-tetramethyljulolidine-9-yl)ethenyl]benzene. In addition, when greenish light-emission is needed to be obtained, substances that can emit light with a peak of emission spectrum in 500 to 550 nm can be used as a light emitting substance, such as N,N'-dimethylquinacridon (abbreviation: DMQd), coumarin 6, coumarin 545T or tris(8-quinolinolate)aluminum (abbreviation: Alq$_3$). In addition, when bluish light-emission is needed to be obtained, substance that can emit light with a peak of emission spectrum in 420 to 500 nm can be used as a light emitting substance such as 9,10-bis(2-naphthyl)-tert-butylanthracene (abbreviation: t-BuDNA); 9,9'-bianthryl,9,10-diphenylanthracene (abbreviation: DPA); 9,10-bis(2-naphthyl)anthracene (abbreviation: DNA); bis(2-methyl-8-quinolinolate)-4-phenylphenolate-gallium (abbreviation: BGaq); or bis(2-methyl-8-quinolinolate)-4-phenylphenolate-aluminum (abbreviation: BAlq). The above-mentioned light emitting substances are a substance which emits fluorescence individually. Besides the above substances, a substance which emits phosphorescence can be used as a light emitting substance such as bis[2-(3,5-bis(trifluorometyl)phenyl)pyridinato-N,C$^{2'}$]iridium(III)picolinato (abbreviation: Ir(CF$_3$ppy)$_2$(pic)); bis[2-(4,6-difluorophenyl)pyridinato)-N,C$^{2'}$]iridium(III)acetylacetonato (abbreviation: FIr(acac)); bis[2-(4,6-difluorophenyl)pyridinato-N,C$^{2'}$]iridium(III)picolinato (abbreviation: FIr(pic)); or tris(2-phenylpyridinato-N,C$^{2'}$)iridium (abbreviation: Ir(ppy)$_3$).

In addition, there is no particular limitation on a substance which is included in the light emitting layer 113 with a light emitting substance and is used for diffusing the light emitting substance, and it may be selected properly by considering an energy gap of a substance used as the light emitting substance or the like. For example, besides anthracene derivatives such as 9,10-di(2-naphthyl)-2-tert-butylanthracene (abbreviation: t-BuDNA); carbazole derivatives such as 4,4'-bis(N-carbazolyl)-biphenyl (abbreviation: CBP); quinoxaline derivatives such as 2,3-bis(4-diphenylaminophenyl)quinoxaline (abbreviation: TPAQn); or 2,3-bis {4-[N-(1-naphthyl)-N-phenylamino]phenyl}-dibenzo[f,h]quinoxaline (abbreviation: NPADiBzQn); metal complexes such as bis[2-(2-hydroxyphenyl)pyridinato]zinc (abbreviation: $Znpp_2$); bis[2-(2-hydroxyphenyl)benzoxazolato]zinc (abbreviation: ZnBOX); or the like, can be used with the light emitting substance.

A hole transporting layer 112 is a layer having a function of transporting holes, and in the light emitting element of the present embodiment mode, it has a function of transporting holes from the hole generating layer 111 to the light emitting layer 113. By providing the hole transporting layer 112, an interval between the hole generating layer 111 and the light emitting layer 113 can be widened, and as a result, quenching of emission due to a metal included in the hole generating layer 111 can be prevented. A hole transporting layer is preferably formed with a substance having a high hole transporting property, and in particular, a substance having a hole mobility equal to or higher than $1\times10^{-6}$ cm$^2$/Vs is preferably used. As for a concrete example of a substance having a high hole transporting property, the concrete example of a substance having a high hole transporting property which can be used for forming the hole generating layer 111 is referred.

An electron transporting layer 114 is a layer having a function of transporting electrons, and in the light emitting element of the present embodiment mode, it has a function of transporting electrons from an electron generating layer 115 to the light emitting element 113. By providing the electron transporting layer 114, an interval between the electron generating layer 115 and the light emitting element 113 can be widened, and as a result, quenching of emission due to a metal included in the electron generating layer 115 can be prevented. An electron transporting layer is preferably formed with a substance having a high electron transporting property, and in particular, a substance having an electron mobility equal to or higher than $1\times10^{-6}$ cm$^2$/Vs is preferably used. Note that the substance having a high electron transporting property is a substance in which an electron mobility is higher than a hole and the rate value of an electron mobility to a hole mobility (=electron mobility/hole mobility) is more than 100. As a concrete example of a substance which can be used for forming the electron transporting layer 114, besides a metal complex such as tris(8-quinolinolato)aluminum (abbreviation: Alq$_3$); tris(4-methyl-8-quinolinolato)aluminum (abbreviation: Almq$_3$); bis(10-hydroxybenzo[h]quinolinato)beryllium (abbreviation: BeBq$_2$); bis(2-methyl-8-quinolinolato)-4-phenylphenolato-aluminum (abbreviation: BAlq); bis[2-(2-hydroxyphenyl)-benzoxazolato]zinc (abbreviation: Zn(BOX)$_2$); or bis[2-(2-hydroxyphenyl)-benzothiazolato]zinc (abbreviation: Zn(BTZ)$_2$), 2-(4-biphenylyl)-5-(4-tert-butylphenyl)-1,3,4-oxadiazole (abbreviation: PBD); 1,3-bis [5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); 4,4-bis(5-methylbenzoxazol-2-yl)stilbene (BzOs); or the like can be given.

Note that each of the hole transporting layer 112 and the electron transporting layer 114 may be formed with a substance having a bipolar characteristic in addition to the above-mentioned substance. Note that the bipolar substance is a substance in which the rate value of a mobility of one carrier to that of a mobility of the other carrier is equal to or less than 100, preferably equal to or less than 10, when a mobility of a carrier of either of an electron or a hole is compared with that of a carrier of the other one. As the substance having bipolar characteristic, for example, 2,3-bis(4-diphenylaminophenyl) quinoxaline (abbreviation: TPAQn); 2,3-bis {4-[N-(1-naphthyl)-N-phenylamino]phenyl}-dibenzo[f,h]quinoxaline (abbreviation: NPADiBzQn); or the like can be given. It is preferable to use, in particular, a substance whose hole and electron mobilities are equal to or higher than $1\times10^{-6}$ cm$^2$/Vs in the substance having a bipolar characteristic. In addition, the hole transporting layer 112 and the electron transporting layer 114 may be formed by using the same substance having a bipolar characteristic.

The first electrode 101 may be formed with a substance whose work function is high, such as gold (Au), platinum (Pt), nickel (Ni), tungsten (W), chromium (Cr), molybdenum (Mo), iron (Fe), cobalt (Co), copper (Cu), palladium (Pd), or a tantalum nitride, or with a substance whose work function is low such as aluminum or magnesium, besides an indium tin oxide, an indium tin oxide including a silicon oxide, and an indium oxide including a zinc oxide. In this manner, in the light emitting element of the present embodiment mode, the first electrode 101 can be formed without depending on the work function of the substance. This is because the hole generating layer 111 is provided between the first electrode 101 and the light emitting layer 113.

In addition, the second electrode 102 may be formed with a substance whose work function is high such as gold (Au), platinum (Pt), nickel (Ni), tungsten (W), chromium (Cr), molybdenum (Mo), iron (Fe), cobalt (Co), copper (Cu), palladium (Pd), or a tantalum nitride, or with a substance whose work function is low such as aluminum or magnesium, besides an indium tin oxide, an indium tin oxide including a silicon oxide, and an indium oxide including a zinc oxide. In this manner, in the light emitting element of the present embodiment mode, the second electrode 102 can be formed without depending on the work function of the substance. This is because the electron generating layer 115 is provided between the second electrode 102 and the light emitting layer 113.

Figure 3:
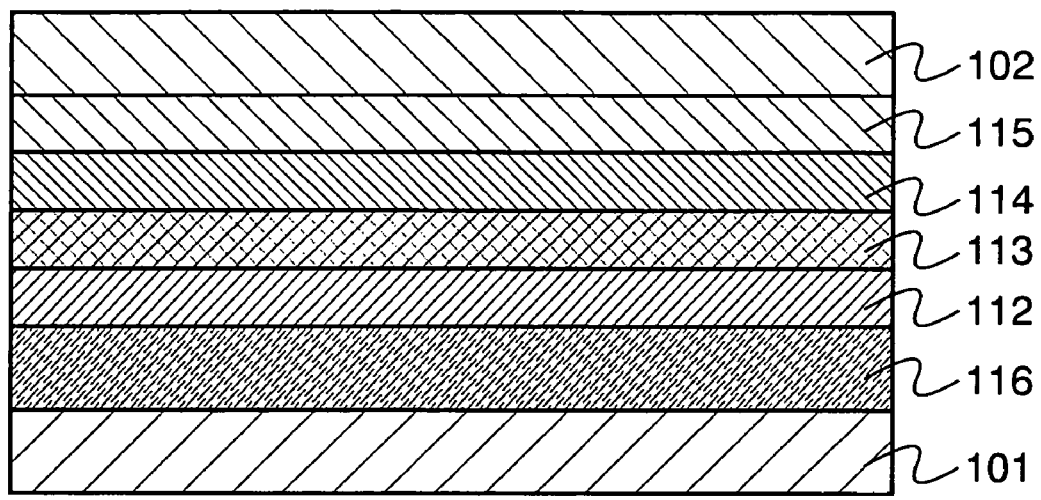
FIG. 3 is a diagram showing one mode of a light emitting element of the present invention.

Note that although the light emitting element having the hole transporting layer 112, the electron transporting layer 114 or the like, is shown in this embodiment mode as well as the hole generating layer 111 and the light emitting layer 113, the mode of the light emitting element is not necessarily limited to this. For example, a light emitting element in which a hole injecting layer 116 is provided, instead of the hole generating layer 111 may be employed as shown in FIG. 3. The hole injecting layer 116 is a layer having a function of supporting an injection of holes from the first electrode 101 to the hole transporting layer 112. By providing the hole injecting layer 116, the difference of ionization potential between the first electrode 101 and the hole transporting layer 112 is released, and holes are easily injected. The hole injecting layer 116 is preferably formed using a substance whose ionization potential is smaller than that of a substance forming the hole transporting layer 112, and whose ionization potential is larger than that of a substance forming the first electrode 101. As a concrete example of a substance which can be used for forming the hole injecting layer 116, a phthalocyanine series compound such as phthalocyanine (abbreviation: H$_2$Pc) or cupper phthalocyanine (CuPC), or a high molecule weight compound such as poly (ethylenedioxythiophene)/ poly (styrene sulfonate acid) aqueous solution (PEDOT/PSS) or the like can be given. Note that the first electrode 101 is preferably formed using a substance whose work function is high such as an indium tin oxide, in the case where the hole injecting layer 116 is provided.

Figure 4:
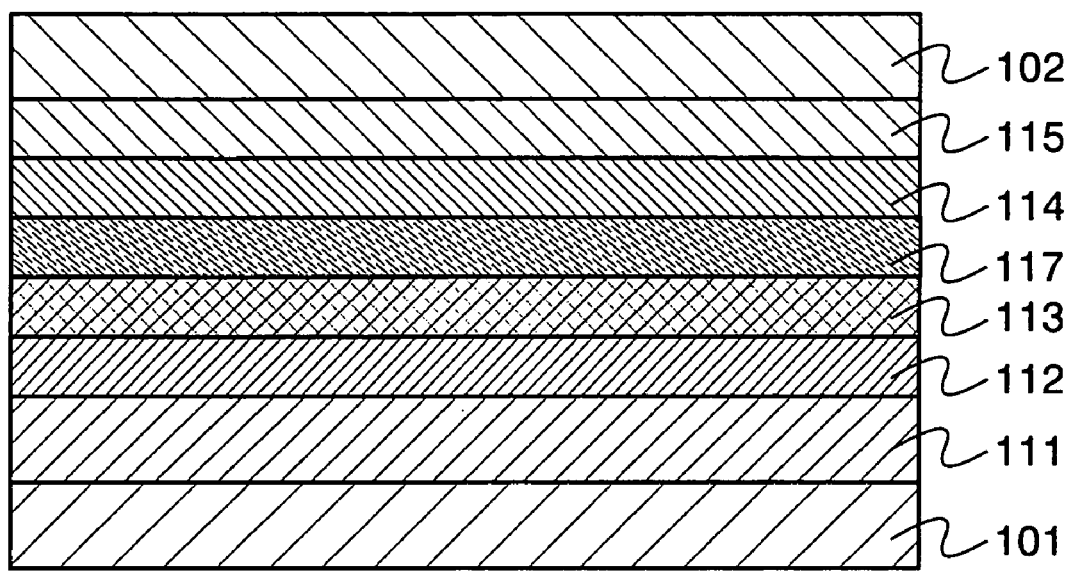
FIG. 4 is a diagram showing one mode of a light emitting element of the present invention.

In addition, a hole blocking layer 117 may be provided between the light emitting layer 113 and the electron transporting layer 114 as shown in FIG. 4. By providing the hole blocking layer 117, holes can be prevented from flowing toward the second electrode 102 through the light emitting layer 113, and thus the recombination efficiency of carriers can be enhanced. In addition, excitation energy generated in the light emitting layer 113 can be prevented from moving to other layers such as the electron transporting layer 114. The hole blocking layer 117 can be formed by selecting a substance whose ionization potential is larger than that of a substance which is used for forming the light emitting layer 113, particularly among substances which can be used for forming the electron transporting layer 114 such as BAlq, OXD-7, TAZ, or BPhen. In other words, the hole blocking layer 117 may be formed so that ionization potential of the hole blocking layer 117 is relatively larger than that of the electron transporting layer 114. In the same manner, a layer which prevents electrons from flowing to the first electrode 101 through the light emitting layer 113 may be provided between the light emitting layer 113 and the hole transporting layer 112.

Note that whether the hole transporting layer 112 and the electron transporting layer 114 are provided or not may be selected properly by the person who carries out the invention. For example, in the case where defectives such as quenching due to a metal does not occur even if the hole transporting layer 112 and the electron transporting layer 114 are not provided, those layers are not necessarily provided.

The above mentioned light emitting element of the present invention has little changes of driving voltage depending on the thickness of the electron generating layer 115. Therefore, the interval between the light emitting layer 113 and the second electrode 102 can be easily adjusted by changing the thickness of the electron generating layer 115. In other words, so as to be the length that the light-emission is extracted to the outside efficiently or so as to be the length that the color impurity of the extracted light-emission to the outside is excellent, the length of light path (light path length), which the emitted light passes, is easily adjusted. Further, by making the electron generating layer 115 thicker, unevenness of the surface of the second electrode 102 is reduced, and short-circuiting between electrodes can be easily prevented.

Note that the light emitting element of the present invention has little change of driving voltage depending on the thickness of the hole generating layer 111. Therefore, by changing the thickness of the hole generating layer 111, the length of light path (light path length), which the emitted light passes, is easily adjusted. Further, by making the hole generating layer 111 thicker, unevenness of the surface of the first electrode 101 is reduced, and short-circuiting between electrodes can be easily prevented.

Embodiment Mode 2

Figure 2:
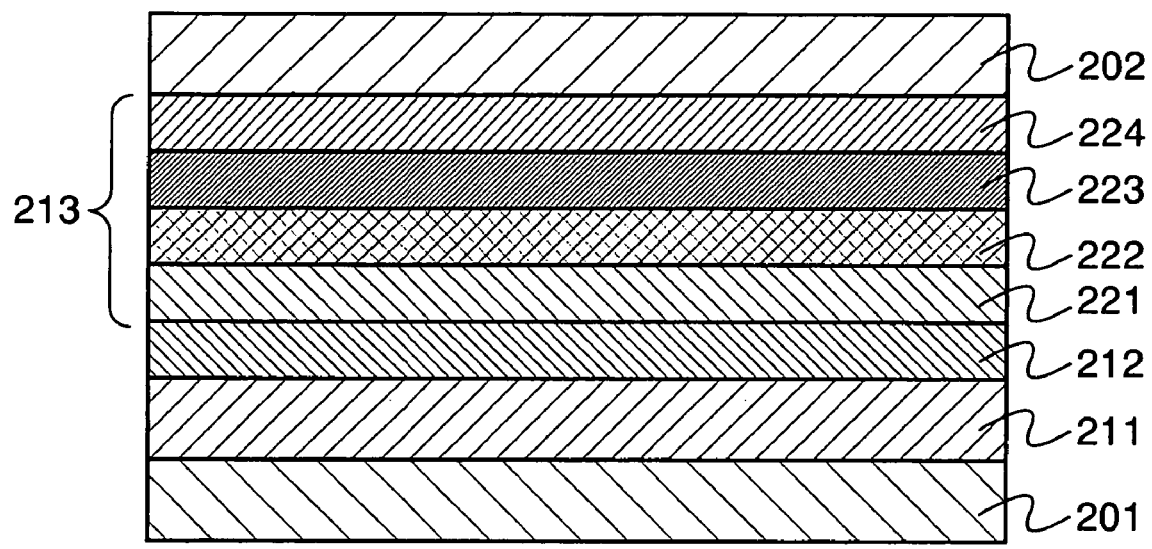
FIG. 2 is a diagram showing one mode of a light emitting element of the present invention.

One mode of the light emitting element of the present invention is described referring to FIG. 2.

In FIG. 2, a light emitting element having a first layer 211, a second layer 212, and a third layer 213 is shown between a first electrode 201 and a second electrode 202. The first layer 211 generates holes, and the second layer 212 generates electrons. In the third layer 213, an electron transporting layer 221, a light emitting layer 222, a hole transporting layer 223, and a hole generating layer 224 are stacked in order. Herein, the hole generating layer 224 is provided more closely to the side of the second electrode 202 than the light emitting layer 222, and the electron transporting layer 221 is provided more closely to the side of the first electrode 201 than the light emitting layer 222. When voltage is applied to the first electrode 201 and the second electrode so that electric potential of the first electrode 201 is lower than that of the second electrode 202, holes are injected from the first layer 211 to the first electrode 201. In addition, electrons and holes are injected from the second layer 212 and the second electrode 202 respectively into the third layer 213. The electrons and holes injected into the third layer 213 are recombined in the light emitting layer 222. In the light emitting layer 222, a light emitting substance is included, and the light emitting substance becomes excited by excitation energy generated due to recombination. The light emitting substance which is excited emits light when it returns to ground state.

Each of the first layer 211 and the hole generating layer 224 is a layer for generating holes, which is a layer formed by mixing at least one selected from the substance having a high hole transporting property and a substance having bipolar characteristic, and a substance showing an electron accepting property to the substances. Herein, a substance having a hole mobility equal to or higher than $1\times10^{-6}$ cm$^2$/Vs is preferable, particularly among the substances having a high hole transporting property and the substance having bipolar characteristic. Note that the substance having a high hole transporting property is a substance of which a hole mobility is higher than an electron, and the rate value of a hole mobility to an electron mobility (=hole mobility/electron mobility) is more than 100. The concrete examples of the substance having a high hole transporting property and the substance having bipolar characteristic are referred to the description of the concrete examples for a substance which can be used for forming the hole transporting layer 112 in the Embodiment Mode 1, respectively. In addition, although there in no particular limitation on a substance showing an electron accepting property, it is preferable to use a metal oxide such as a molybdenum oxide, a vanadium oxide, a ruthenium oxide, or a rhenium oxide. Note that, besides those, a metal oxide such as a titanium oxide, a chromium oxide, a zirconium oxide, a hafnium oxide, a tantalum oxide, a tungsten oxide, or a silver oxide may be used.

The second layer 212 is a layer for generating electrons, and formed by mixing the phenanthroline derivative represented by the general formula (1) and a substance showing an electron donating property to the phenanthroline derivative represented by the general formula (1). In the second layer 212 having such a structure, the phenanthroline derivative represented by the general formula (1) accepts electrons from a substance showing an electron donating property. In other words, the phenanthroline derivative represented by the general formula (1) is reduced and electrons are generated.

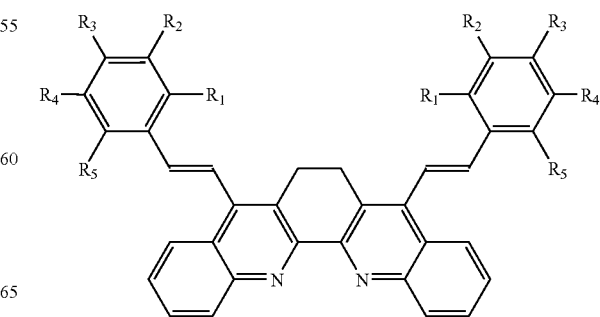

(1)

In the general formula (1), $R^1$ to $R^5$ individually represents an alkyl group having 1 to 4 carbon atoms or a halogen group such as fluorine, chlorine, iodine, and bromine, and further at least one of $R^1$ to $R^5$ represents a halogen group.

Since the phenanthroline derivative represented by the general formula (1) has a halogen element such as fluorine as a substituent, it easily accepts electrons. In addition, by using the phenanthroline derivative represented by the general formula (1), electrons are easily generated, and electrons can be stably supplied to a light emitting layer. Moreover, by mixing the phenanthroline derivative and a substance showing an electron donating property to the phenanthroline derivative, the conductivity is more improved than a layer formed with only the phenanthroline derivative. Therefore, by making the second layer 212 thicker, it is easy to adjust the length of light path or to reduce the unevenness of the surface of the electrode. Note that, since the electron generating layer 115 which is formed by mixing the phenanthroline derivative and the substance showing an electron donating property to the phenanthroline derivative is difficult to be crystallized, defective elements due to crystallization is difficult to be generated.

Note that it is preferable to use a phenanthroline derivative having an electron mobility of $1\times10^{-6}$ cm$^2$/Vs particularly among the phenanthroline derivative represented by the general formula (1). In addition, as the substance showing an electron donating property to the phenanthroline derivative represented by the general formula (1), a substance selected from an alkali metal or an alkali earth metal, concretely lithium (Li), calcium (Ca), sodium (Na), potassium (K), and magnesium (Mg) or the like can be used. In addition, an alkali metal oxide such as a lithium oxide (Li$_2$O), a sodium oxide (Na$_2$O), or a potassium oxide (K$_2$O), and an alkali earth metal oxide such as a calcium oxide (CaO) or a magnesium oxide (MgO) can be used as the substance showing an electron donating property. Furthermore, an alkali metal fluoride such as a lithium fluoride (LiF) or a cesium fluoride (CsF); an alkali earth metal fluoride such as a calcium fluoride (CaF$_2$); an alkali earth metal nitride such as a calcium nitride (Ca$_3$N$_2$); or the like can be used as the substance showing an electron donating property. By combining (mixing) at least one selected from an alkali metal, an alkali earth metal, an alkali metal oxide, an alkali earth metal oxide, an alkali metal fluoride, an alkali earth metal fluoride, or an alkali earth metal nitride, and the phenanthroline derivative represented by the general formula (1), crystallization of the electron generating layer 115 can be suppressed and a defective operation of an element due to crystallization can be reduced. Note that metal compounds such as an alkali metal oxide, an alkali earth metal oxide, an alkali metal nitride, or an alkali earth metal nitride are preferable, since they have a low reactivity and they are easy to treat.

An electron transporting layer 221 is a layer having a function of transporting electrons, and in the light emitting element of the present embodiment mode, it has a function of transporting electrons from the second layer 212 to the light emitting layer 222. By providing the electron transporting layer 221, the interval between the second layer 212 and the light emitting layer 222 can be increased, and as a result, quenching due to a metal included in the second layer 212 can be prevented. An electron transporting layer is preferable to be formed with a substance having a high electron transporting property, particularly preferable to be formed with a substance having an electron mobility equal to or higher than $1\times10^{-6}$ cm$^2$/Vs. As for a concrete example of a substance which can be used for forming the electron transporting layer 221, the concrete example of a substance which can be used for forming the electron transporting layer 114 in the Embodiment Mode 1 is referred.

The light emitting layer 222 includes a light emitting substance. The light emitting layer 222 may be a layer formed with only a light emitting substance; however, in a case where concentration quenching is generated, a layer, in which a light emitting substance is mixed to be dispersed in a layer formed with a substance having a larger energy gap than an energy gap of a light emitting substance, is preferably used. By dispersing a light emitting substance to be included in the light emitting layer 222, light-emission can be prevented from quenching due to concentration. Note that as for a light emitting substance, description of the light emitting substance in the Embodiment Mode 1 is referred. Herein, as for a substance which is included in the light emitting layer 222 as well as a light emitting substance and used for dispersing a light emitting substance, description of the substance which is included in the light emitting layer 113 as well as the light emitting substance described in the Embodiment Mode 1, and used for dispersing a light emitting substance is referred.

The hole transporting layer 223 is a layer having a function of transporting holes, and in the light emitting element of the present embodiment mode, it has a function of transporting holes from the hole generating layer 224 to the light emitting layer 222. By providing the hole transporting layer 223, the interval between the hole generating layer 224 and the light emitting layer 222 can be increased, and as a result, light-emission can be prevented from quenching due to a metal included in the hole generating layer 224. The hole transporting layer 223 is preferable to be formed with a substance having a high hole transporting-property, and in particular, preferable to be formed with a substance having a hole mobility equal to or higher than $1\times10^{-6}$ cm$^2$/Vs. As for a concrete example of a substance which can be used for forming the hole transporting layer 223, the concrete example of a substance which can be used for forming the hole transporting layer 112 in the Embodiment Mode 1 is referred.

The first electrode 201 may be formed with a substance whose work function is high, such as gold (Au), platinum (Pt), nickel (Ni), tungsten (W), chromium (Cr), molybdenum (Mo), iron (Fe), cobalt (Co), copper (Cu), palladium (Pd), or a tantalum nitride, or with a substance whose work function is low, such as aluminum or magnesium, besides an indium tin oxide, an indium tin oxide including a silicon oxide, and an oxide indium including 2 to 20% of a zinc oxide. In this manner, the first electrode 201 can be formed without depending on work function of a substance, in the light emitting element of the present embodiment mode. This is because the first electrode 211 and the second layer 212 are provided between the first electrode 201 and the light emitting layer 222.

In addition, the second electrode 202, also, may be formed with a substance whose work function is high, such as gold (Au), platinum (Pt), nickel (Ni), tungsten (W), chromium (Cr), molybdenum (Mo), iron (Fe), cobalt (Co), copper (Cu), palladium (Pd), or a tantalum nitride, or with a substance whose work function is low, such as aluminum or magnesium, besides an indium tin oxide, an indium tin oxide including a silicon oxide, and an oxide indium including 2 to 20% of a zinc oxide. In this manner, the second electrode 202 can be formed without depending on work function of a substance, in the light emitting element of the present embodiment mode. This is because the hole generating layer 224 is provided between the second electrode 202 and the light emitting layer 222.

Figure 5:
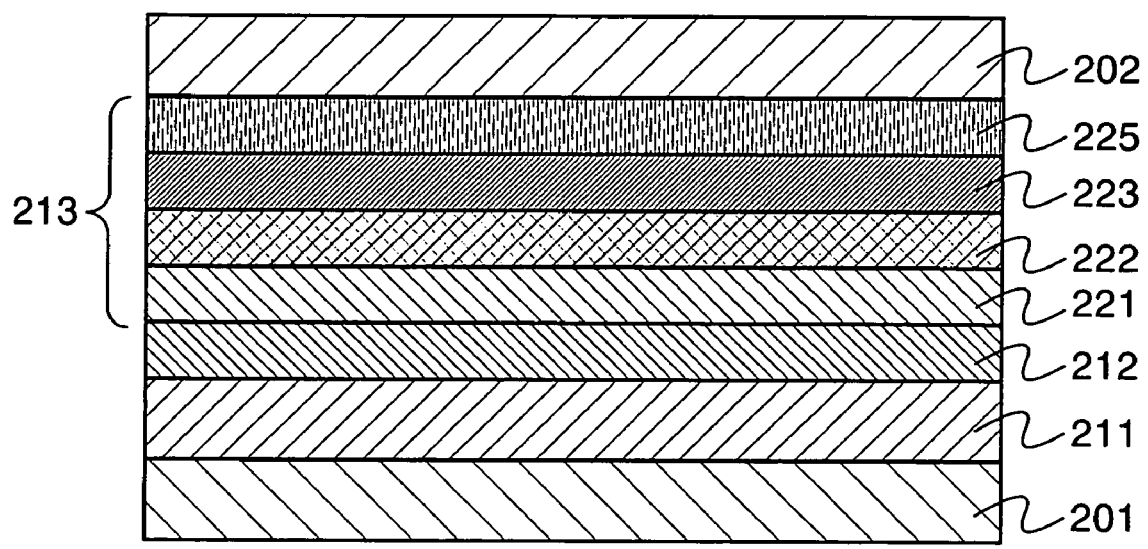
FIG. 5 is a diagram showing one mode of a light emitting element of the present invention.

Note that, in the present embodiment mode, although a light emitting element in which the third layer 213 including a light emitting substance is multilayer including the electron transporting layer 221, the light emitting layer 222, the hole transporting layer 223, and the hole generating layer 224 is shown, the mode of the light emitting element is not necessarily limited to this. For example, a light emitting element provided with a hole injecting layer 225 instead of the hole generating layer 224 may be employed as shown in FIG. 5. The hole injecting layer 225 is a layer having a function of supporting injection of holes from the second electrode 202 to the hole transporting layer 223. By providing the hole injecting layer 225, the difference of ionization potential between the second electrode 202 and the hole transporting layer 223 is reduced, and holes are easily injected. It is preferable to form the hole injecting layer 225 with a substance whose ionization potential is smaller than that of a substance forming the hole transporting layer 223 and whose ionization potential is larger than that of a substance forming the second electrode 202. In other words, as a concrete example of a substance which can be used for forming the hole injecting layer 225, phthalocyanine series compound such as phthalocyanine (abbreviation: $H_2PC$) or cupper phthalocyanine (CuPC), or high molecular weight compound such as poly(ethylenedioxythiophene)/poly(styrene sulfonate acid) aqueous solution (PEDOT/PSS) or the like can be given. Note that, in the case where the hole injecting layer 225 is provided, the second electrode 202 is preferably formed by using a substance whose work function is high, such as an indium tin oxide.

Figure 6:
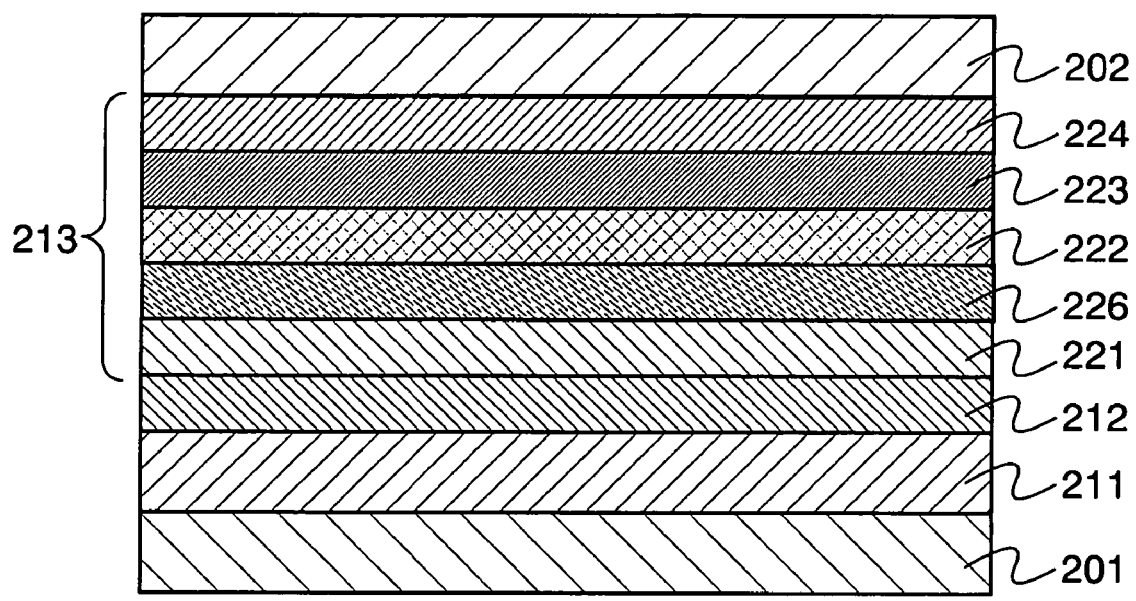
FIG. 6 is a diagram showing one mode of a light emitting element of the present invention.

In addition, a hole blocking layer 226 may be provided between the light emitting layer 222 and the electron transporting layer 221 as shown in FIG. 6. By providing the hole blocking layer 226, holes can be prevented from flowing toward the first electrode 201 through the light emitting layer 222, and the recombination efficiency of carriers can be enhanced. In addition, excitation energy generated in the light emitting layer 222 can be prevented from moving to the other layers such as the electron transporting layer 221. The hole blocking layer 226 can be formed by selecting a substance whose ionization potential is larger than that of a substance which is used for forming the light emitting layer 222, particularly among substances which can be used for forming the electron transporting layer 221 such as BAlq, OXD-7, TAZ, or BPhen. In other words, the hole blocking layer 117 may be formed so as to make ionization potential of the hole blocking layer 226 is relatively larger than that of the electron transporting layer 221. In the same manner, a layer which prevents electrons from flowing toward the second electrode 202 through the light emitting layer 222 may be provided also between the light emitting layer 222 and the hole transporting layer 223.

Note that whether the hole transporting layer 223 and the electron transporting layer 221 are provided or not may be selected properly by the person who carries out the invention, for example, in the case where defectives such as quenching due to a metal does not occur even if the hole transporting layer 223 and the electron transporting layer 221 are not provided, those layers are not necessarily provided.

Note that in the light emitting element as described above, the difference between electron affinity of a substance having a high electron transporting property which is included in the second layer 212, and electron affinity of a substance which is included in a layer being in contact with the second layer 212 among the layers included in the third layer 213 is preferably equal to or less than 2 eV, more preferably equal to or less than 1.5 eV. More concretely, like the light emitting element shown in FIG. 2, when the second layer 212 and the electron transporting layer 221 are contacted, the difference between electron affinity of a substance having an electron transporting property which is included in the second layer 212, and electron affinity of a substance having an electron transporting property which is included in the electron transporting layer 221 is preferably equal to or less than 2 eV, more preferably equal to or less than 1.5 eV. In this manner, electrons can be effectively injected from the second layer 212 into the third layer 213 by bonding the second layer 212 and the third layer 213.

The above-described light emitting element of the present invention is an element which has little changes of driving voltage depending on the thickness of the second layer 212. Therefore, the interval between the light emitting layer 222 and the first electrode 201 can be adjusted easily by changing the thickness of the second layer 212. In other words, so as to be the length that the light-emission is extracted to the outside efficiently or so as to be the length that the color impurity of the extracted light-emission to the outside is excellent, the length of light path (light path length), which the emitted light passes, is easily adjusted.

Embodiment Mode 3

The light emitting element of the present invention can reduce a defective operation due to crystallization of a compound. Moreover, one of the light emitting elements of the present invention is one in which short-circuiting between electrodes can be prevented by making the thickness of an electron generating layer thicker. In addition, one of the light emitting elements of the present invention is one in which the length of light path is adjusted, efficiency of extracting light-emission to the outside is enhanced, and light-emission with excellent color impurity can be obtained by changing the thickness of an electron generating layer. Therefore, an excellent light emitting device with few defective displays due to defective operation of a light emitting element can be obtained by using a light emitting element of the present invention as a pixel. In addition, a light emitting device which can provide an image having excellent display color can be obtained by using the light emitting element of the present invention as a pixel. In addition, by using the light emitting element of the present invention as light source, a light emitting device which can light excellently with few defectives due to defective operation of a light emitting element can be obtained.

In the present embodiment mode, circuit structures and driving methods of a light emitting device with a display function will be described with referring FIGS. 7 to 11.

Figure 7:
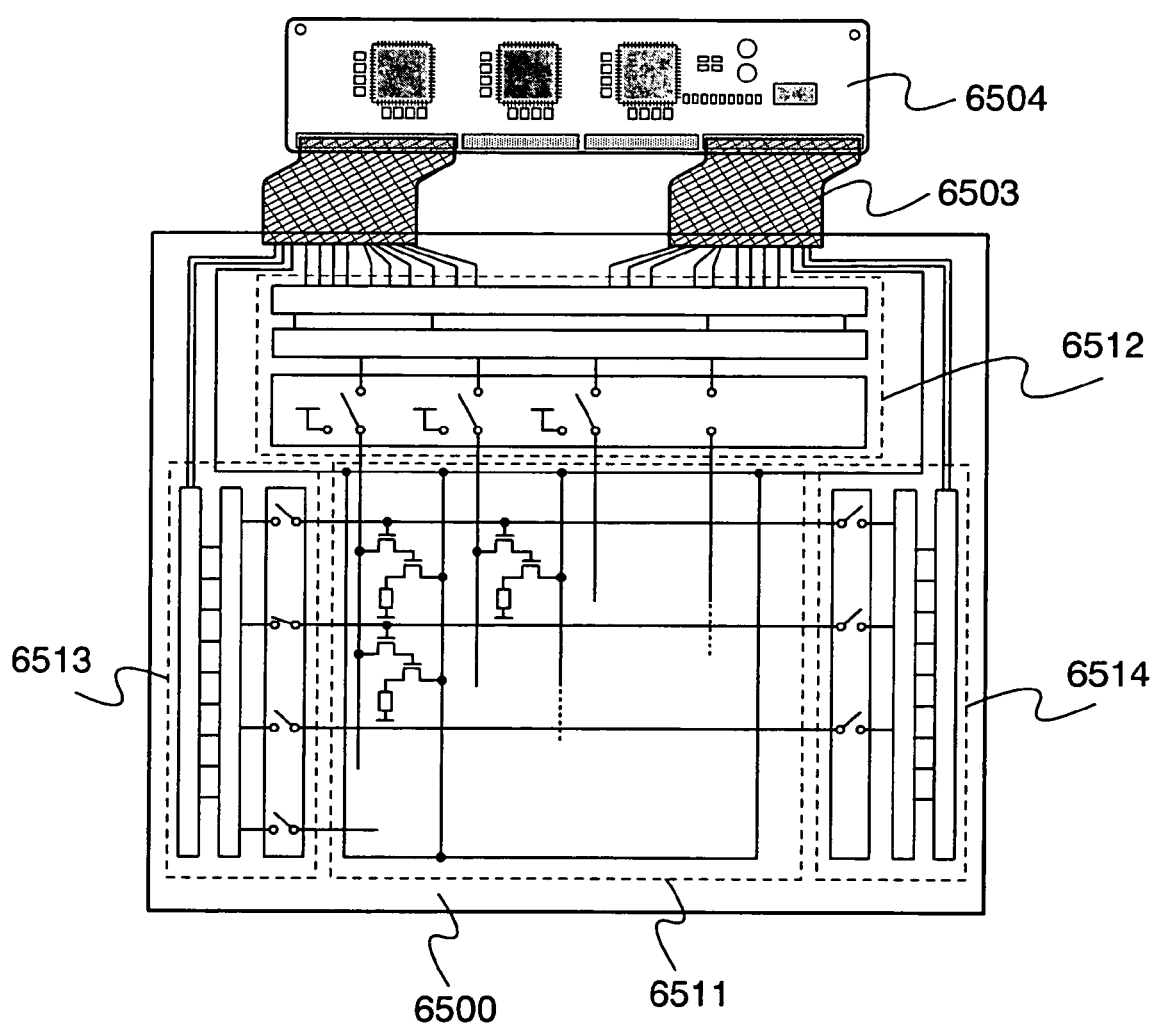
FIG. 7 is a top view showing one mode of a light emitting device of the present invention.

FIG. 7 is a schematic diagram of a light emitting device, viewed from the top side, to which the present invention is applied. In FIG. 7, a pixel portion 6511, a source signal line driver circuit 6512, a writing gate signal line driver circuit 6513 and an erasing gate signal line driver circuit 6514 are formed over a substrate 6500. The source signal line driver circuit 6512, the writing gate signal line driver circuit 6513 and the erasing gate signal line driver circuit 6514 are connected to FPCs (flexible printed circuit) 6503 respectively, which are external input terminals, via a wiring group. Each of the source signal line driver circuit 6512, the writing gate signal line driver circuit 6513 and the erasing gate signal line driver circuit 6514 receives video signals, clock signals, start signals, reset signals and the like from the FPCs 6503. A printed wiring board (PWB) 6504 is attached to the FPCs 6503. Further, the driver circuit portion is not necessarily formed over the same substrate as the pixel portion 6511 as described above. For example, it may be provided outside of the substrate by utilizing one (TCP) in which an IC chip is mounted on an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuit sets including a light emitting element are aligned in the pixel portion 6511.

Figure 8:
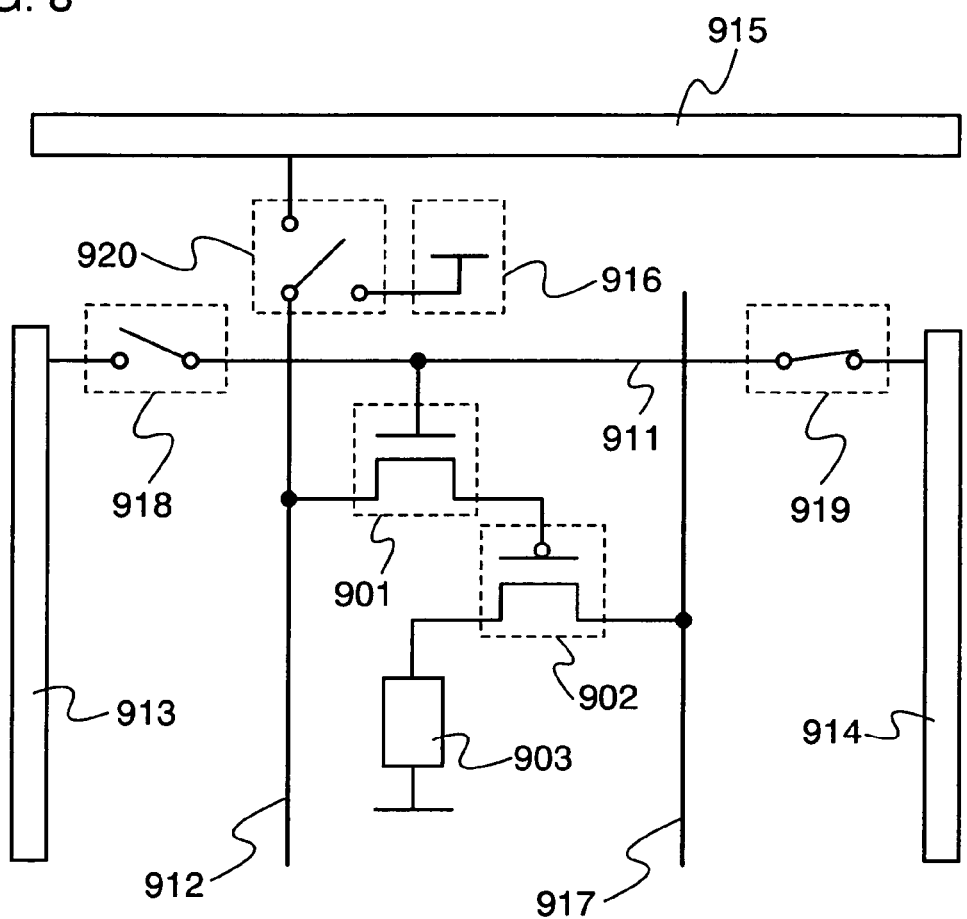
FIG. 8 is a diagram showing one mode of a circuit for driving a pixel provided in a light emitting device of the present invention.

FIG. 8 is a diagram showing a circuit for operating one pixel. The circuit shown in FIG. 8 includes a first transistor 901, a second transistor 902 and a light emitting element 903.

Each of the first transistor 901 and the second transistor 902 is a three-terminal element including a gate electrode, a drain region and a source region. A channel region is provided between the drain region and the source region. Herein, the source region and the drain region are exchangeable depending on a structure and an operational condition of a transistor or the like, and therefore, it is difficult to determine which is the source region or the drain region. Accordingly, the region serving as the source or the drain is denoted as a first electrode and a second electrode of a transistor, respectively, in the present embodiment mode.

A gate signal line 911 and a writing gate signal line driver circuit 913 are provided to be electrically connected or disconnected by a switch 918. The gate signal line 911 and an erasing gate signal line driver circuit 914 are provided to be electrically connected or disconnected by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor is electrically connected to the source signal line 912 while the second electrode is electrically connected to a gate electrode of the second transistor 902. The first electrode of the second transistor 902 is electrically connected to a current supply line 917 while the second electrode is electrically connected to an electrode included in a light emitting element 903. Further, the switch 918 may be included in the writing gate signal line driver circuit 913. The switch 919 may also be included in the erasing gate signal line driver circuit 914. In addition, the switch 920 may also be included in the source signal line driver circuit 915.

Figure 9:
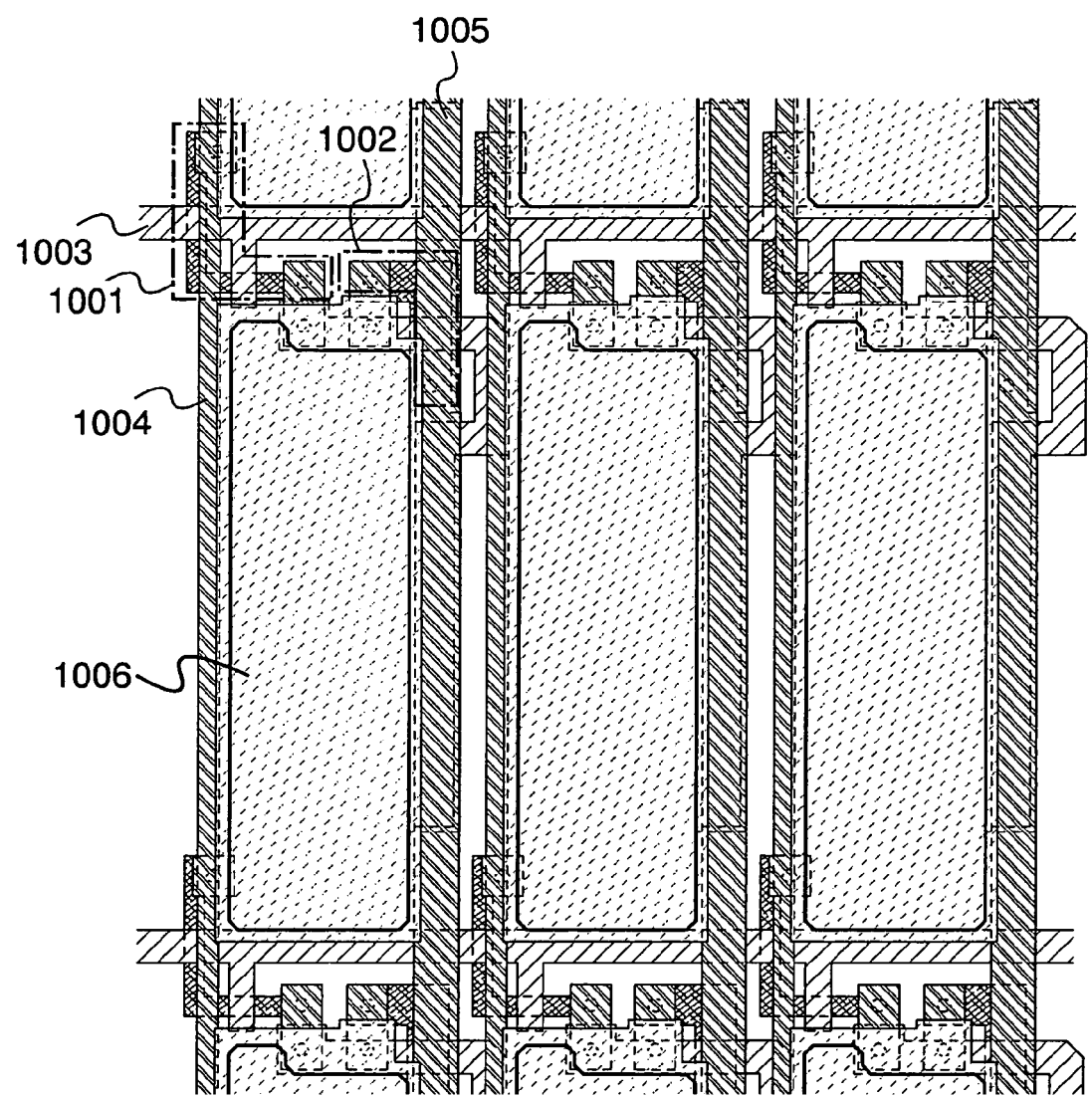
FIG. 9 is a diagram showing one mode of a pixel portion included in a light emitting device of the present invention.

The arrangement of transistors, light emitting elements and the like in the pixel portion is not especially limited. For example, the arrangement as shown in the top view of FIG. 9 can be employed. In FIG. 9, a first electrode of a first transistor 1001 is connected to a source signal line 1004 while a second electrode is connected to a gate electrode of a second transistor 1002. A first electrode of the second transistor is connected to a current supply line 1005 and a second electrode is connected to an electrode 1006 of a light emitting element. A part of the gate signal line 1003 functions as a gate electrode of the first transistor 1001.

Figure 10:
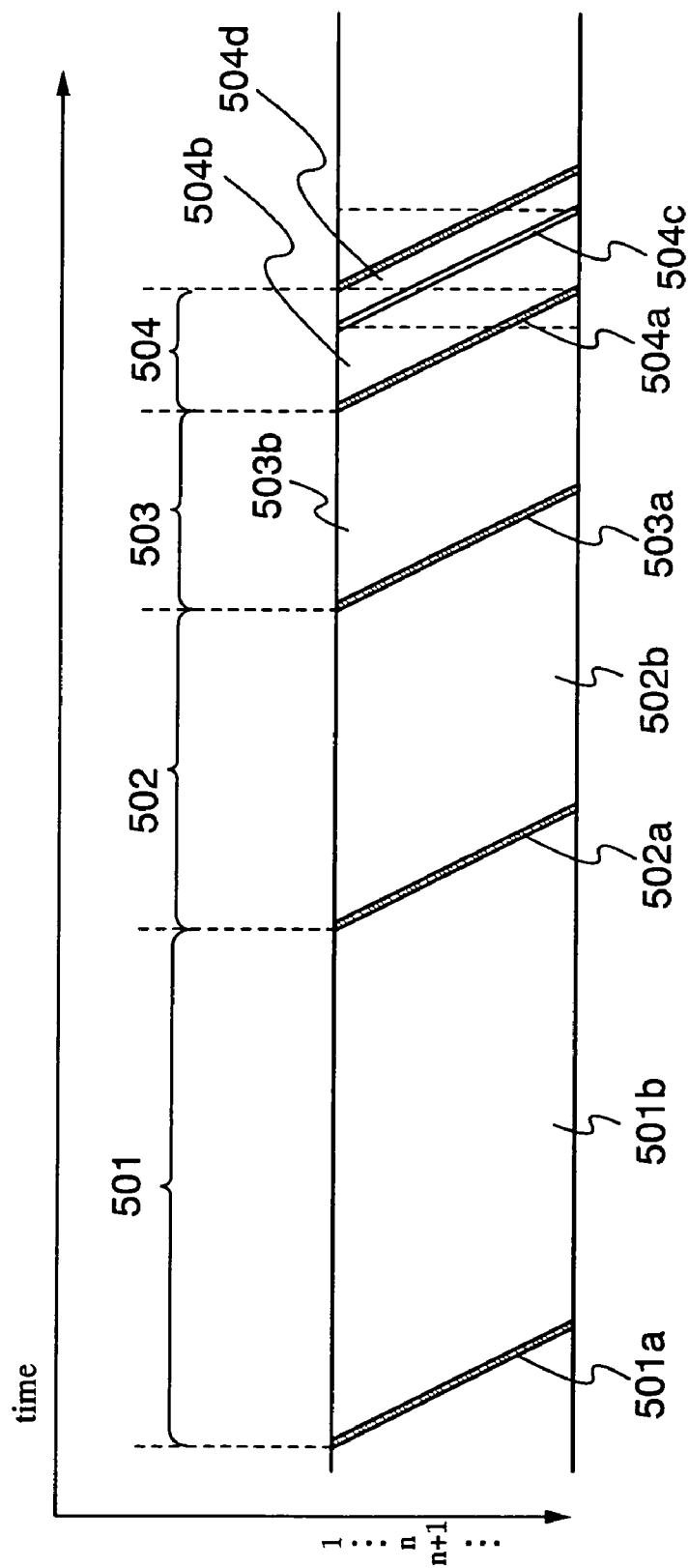
FIG. 10 is a frame diagram showing a driving method for driving a pixel included in a light emitting device of the present invention.

Next, a driving method will be described below. FIG. 10 is a diagram describing an operation of a frame with time. In FIG. 10, a horizontal direction indicates time passage while a vertical direction indicates the number of scanning stages of a gate signal line.

When an image is displayed with a light emitting device of the present invention, a rewriting operation and a displaying operation of the image are repeatedly carried out in a display period. The number of rewriting is not especially limited; however, it is preferably performed approximately sixty times per second so that a person who watches the image does not find flickering (flicker). Herein, a period when the operations of rewriting and displaying of one image (one frame) are carried out is referred to as one frame period.

One frame is time-divided into four sub-frames 501, 502, 503, and 504 including write periods 501a, 502a, 503a, and 504a, and retention periods 501b, 502b, 503b, and 504b as shown in FIG. 10. A light emitting element that receives a light-emission signal emits light in the retention period. The length ratio of the retention periods in each of sub-frames: the first sub-frame 501; the second sub-frame 502; the third sub-frame 503; the fourth sub-frame 504 is $2^3:2^2:2^1:2^0=8:4:2:1$. Accordingly, a 4-bit gray scale can be realized. The number of bits or gray scale levels is not limited to these described here. For instance, an 8-bit gray scale may be carried out by providing eight sub-frames.

An operation in one frame is described. Firstly, a writing operation is carried out from the first row to the last row subsequently in the sub-frame 501. Therefore, the starting time of a write period is different depending on the rows. The row where the write period 501a is completed shifts subsequently to the retention period 501b. In the retention period, a light emitting element that receives a light-emission signal emits light. The row where the retention period 501b is completed shifts subsequently to the sub-frame 502, and a writing operation is carried out from the first row to the last row subsequently as well as the case of the sub-frame 501. Operations as described above are repeatedly carried out to complete the retention period 504b of the sub-frame 504. After an operation in the sub-frame 504 is completed, it shifts to the next frame. In this manner, the sum of light-emission time in each of the sub-frames is a light-emission time of each light emitting element in one frame. By varying the light-emission time for each light emitting element to be variously combined in one pixel, various display colors can be formed with different brightness and chromaticity.

As in the sub-frame 504, when a retention period in the row where writing has been completed and it shifts to the retention period is intended to be forcibly terminated before completing the writing of the last row, an erase period 504c is preferably provided, after the retention period 504b, to forcibly control to be non-light emitting state. The row which is forcibly made to be non-light emitting state keeps non-light emitting state during a fixed period (this period is referred to as a non-light emission period 504d). Immediately after completing the write period of the last row, it shifts to the next write period (or a frame) from the first row in order. This makes it possible to prevent the write period of the sub-frame 504 from overlapping a write period of the next sub-frame.

In the present embodiment mode, the sub-frames 501 to 504 are arranged in order from the longest retention period; however, they are not necessarily arranged like the present embodiment. For instance, they may be arranged in order from the shortest retention period, or may be arranged at random combining short retention periods and long retention periods. The sub-frame may be further divided into a plurality of frames. That is, scanning of the gate signal line may be carried out a plurality of times during the period of giving the same video signal.

Herein, an operation of a circuit in a write period and an erase period shown in FIG. 8 is described.

First, an operation in the write period is explained. In the write period, the gate signal line 911 in the n-th row (n is a natural number) is electrically connected to the writing gate signal line driver circuit 913 via the switch 918, and it is disconnected to the erasing gate signal line driver circuit 914. The source signal line 912 is electrically connected to the source signal line driver circuit via the switch 920. Herein, a signal is inputted to the gate of the first transistor 901 connected to the gate signal line 911 in the n-th row (n is a natural number), and thus, the first transistor 901 is turned ON. At this time, video signals are simultaneously inputted to the source signal lines in the first column to the last column. Note that video signals inputted from the source signal line 912 at each column are independent from each other. The video signal inputted from the source signal line 912 is inputted to the gate electrode of the second transistor 902 via the first transistor 901 connected to each source signal line. At this time, the signal inputted to the second transistor 902 determines a current value which is supplied from the current supply line 917 to the light emitting element 903. In addition, whether the light emitting element 903 emits light or not is determined depending on the current value. For example, in the case where the second transistor 902 is a P-channel type, the light emitting element 903 emits light when a Low Level signal is inputted to the gate electrode of the second transistor 902. On the other hand, in the case where the second transistor 902 is an N-channel type, the light emitting element 903 emits light when a High Level signal is inputted to the gate electrode of the second transistor 902.

Next, an operation in the erase period is described. In the erase period, the gate signal line 911 of the n-th row (n is a natural number) is electrically connected to the erasing gate signal line driver circuit 914 via the switch 919, and it is disconnected to the writing gate signal line driver circuit 913. The source signal line 912 is electrically connected to the power source 916 via the switch 920. A signal is inputted to the gate of the first transistor 901 which is connected to the gate signal line 911 in the n-th row, and thus, the first transistor 901 is turned ON. At this time, erase signals are simultaneously inputted to the source signal lines in the first column to the last column. The erase signal inputted from the source signal line 912 is inputted to the gate electrode of the second transistor 902 via the first transistor 901 which is connected to each source signal line. By the signal inputted to the second transistor 902, current supply from the current supply line 917 to the light emitting element 903 is blocked. The light emitting element 903 does not emit light forcibly. For example, in the case where the second transistor 902 is a P-channel type, the light emitting element 903 does not emit light when a High Level signal is inputted to the gate electrode of the second transistor 902. On the other hand, in the case where the second transistor 902 is an N-channel type, the light emitting element 903 does not emit light when a Low Level signal is inputted to the gate electrode of the second transistor 902.

In the erase period, a signal for erasing is inputted to the n-th (n is a natural number) row by the operation as described above. However, as described above, there is a case that the n-th row is in an erase period, and another row (m-th row, (m is a natural number)) is in a write period. In this instance, it is necessary that a signal for erasing is inputted to the n-th row and a signal for writing is inputted to the m-th row by utilizing a source signal line of the same column. Accordingly, an operation described as follows is preferably carried out.

Immediately after the light emitting element 903 in the n-th row is brought into a non-emission state by the operation in the erase period described above, the gate signal line 911 and the erasing gate signal line driver circuit 914 are disconnected, and the source signal line 912 and the source signal line driver circuit 915 are connected by changing the switch 920. As well as connecting the source signal line to the source signal line driver circuit 915, the gate signal line 911 and the writing gate signal line driver circuit 913 are connected. A signal is selectively inputted to the signal line in the m-th row from the writing gate signal line driver circuit 913, and when the first transistor is turned ON, signals for writing are inputted to the source signal lines in the first column to the last column from the source signal line driver circuit 915. The light emitting element in the m-th row emits light or no light depending on this signal.

Immediately after completing the write period of the m-th row as described above, it shifts to an erase period in the (n+1)-th row. For this, the gate signal line 911 and the writing gate signal line driver circuit 913 are disconnected, and the source signal line and the power source 916 are connected by changing the switch 920. Further, the gate signal line 911 and the writing gate signal line driver circuit 913 are disconnected, and the gate signal line 911 and the erasing gate signal line driver circuit 914 are connected. When a signal is selectively inputted to the gate signal line in the (n+1)-th row from the erasing gate signal line driver circuit 914, a signal is made ON to the first transistor, and an erase signal is inputted from the power source 916. Immediately after completing the erase period in the (n+1)-th row, it shifts to a write period in the (m+1)-th row. Hereinafter, in the same manner, an erase period and a write period may be carried out repeatedly to operate until an erase period of the last row.

In the present embodiment mode, a mode in which the write period in the m-th row is provided between the erase period of the n-th row and the erase period of the (n+1)-th row is described. Without being limited to this; however, the write period of the m-th row may be provided between the erase period of the (n−1)-th row and the erase period of the n-th row.

In the present embodiment mode, when providing the non-light emission period 504d as in the sub-frame 504, as well as disconnecting the erasing gate signal line driver circuit 914 to a certain gate signal line, an operation of connecting the writing gate signal line driver circuit 913 to another gate signal line is repeatedly carried out. Such an operation may be carried out in a frame which does not especially include a non-light emission period.

Embodiment Mode 4

One mode of a cross sectional view of a light emitting device including a light emitting element of the present invention will be described referring FIG. 11.

In FIG. 11, a portion surrounded by a dashed line represents a transistor 11 which is provided for driving a light emitting element 12 of the present invention. The light emitting element 12 is a light emitting element of the present invention which includes a layer 15 in which a hole generating layer, an electron generating layer and a layer including a light emitting substance are stacked between a first electrode 13 and a second electrode 14. A drain of the transistor 11 and the first electrode 13 are electrically connected to each other by a wiring 17 which passes through a first interlayer insulating film 16 (16a, 16b and 16c). The light emitting element 12 is isolated from other light emitting elements, which is provided adjacently, by a partition layer 18. The light emitting device of the present invention having this structure is provided over a substrate 10 in the present embodiment mode.

The transistor 11 as shown in FIG. 11 is a top-gate type in which a gate electrode is provided on an opposite side to the substrate, considered a semiconductor layer as a center. Note that the structure of the transistor 11 is not especially limited. For example, a bottom-gate type may be employed. In the case of a bottom-gate type, either one in which a protection film is formed over a semiconductor layer forming a channel (a channel protection type) or one in which a part of a semiconductor layer forming a channel is concave state (a channel etched type) may be used. Reference numeral 21 denotes a gate electrode, 22: a gate insulating film, 23: a semiconductor layer, 24: an n-type semiconductor layer, 25: an electrode; and 26: a protection film.

The semiconductor layer making up the transistor 11 may be crystalline, non-crystalline, semi-amorphous, or the like.

Note that the semi-amorphous semiconductor is as follows. It has an intermediate structure between an amorphous and a crystalline structure (including a single crystalline and a polycrystalline), and a third condition that is stable in term of free energy. It further includes a crystalline region having a short range order along with lattice distortion. A crystal grain with a size of 0.5 to 20 nm is included in at least a part of a film. Raman spectrum is shifted toward a lower wavenumber than 520 cm$^{-1}$. The diffraction peaks of (111) and (220), which are believed to be derived from Si crystal lattice, are observed in the X-ray diffraction. It contains hydrogen or halogen of at least 1 atom % or more for terminating dangling bonds (dangling bonds). It is also referred to as a so-called microcrystalline semiconductor (microcrystal semiconductor). It is formed by glow discharge decomposition (plasma CVD) using a gas selected from SiH4, Si2H6, SiH2Cl2, SiHCl3, SiCl4, or SiF4. Those gases may be diluted with $H_2$, or $H_2$ and one or more of rare gas elements selected from He, Ar, Kr or Ne. The dilution ratio is set to be in the range of 2 to 1000 times. The pressure is set to be approximately in the range of 0.1 to 133 Pa. The power frequency is set to be 1 MHz to 120 MHz, preferably, 13 MHz to 60 MHz. The substrate heating temperature may be set to be 300° C. or less, more preferably, 100 to 250° C. As to impurity elements included in the film, each of impurities for atmospheric constituents such as oxygen, nitrogen or carbon is preferably set to be $1 \times 10^{20}$/cm$^3$ or less. In particular, the oxygen concentration is set to be $5 \times 10^{19}$/cm$^3$ or less, preferably, $1 \times 10^{19}$/cm$^3$ or less. The mobility of a TFT (thin film transistor) using a semi-amorphous semiconductor is about 1 to 10 m$^2$/Vsec.

As a specific example of a crystalline semiconductor layer, ones made with single crystalline silicon, polycrystalline silicon, silicon germanium, or the like can be cited. They may be formed by laser crystallization. For example, they may be formed by crystallization with use of a solid phase growth method using nickel or the like.

When a semiconductor layer is formed with an amorphous substance, for example, amorphous silicon, a light emitting device with a circuit composed of only N-channel transistors as the transistor 11 and the other transistors (transistors which makes up a circuit for driving a light emitting element), is preferable. Alternatively, a light emitting device with a circuit composed of either an N-channel or a P-channel transistor may be employed. Also, a light emitting device with a circuit composed of both transistors may be used.

Figure 11A:
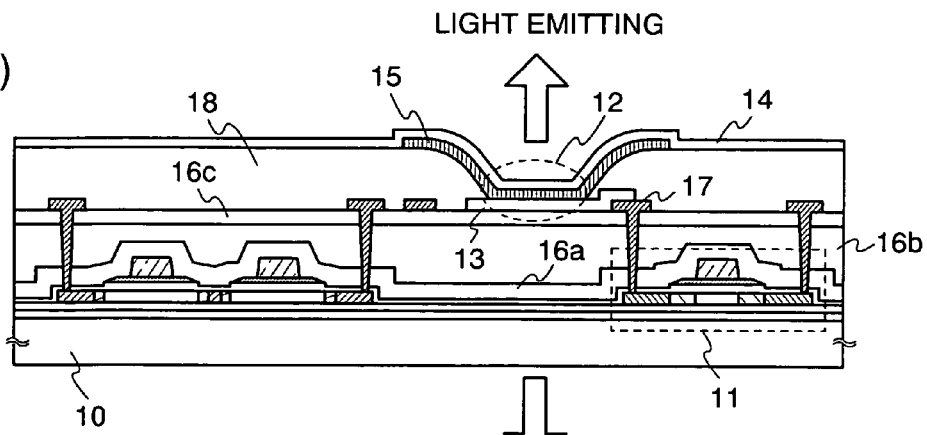
FIGS. 11(A)-11(C) are diagrams showing one mode of cross-section of a light emitting device of the present invention.
Figure 11B:
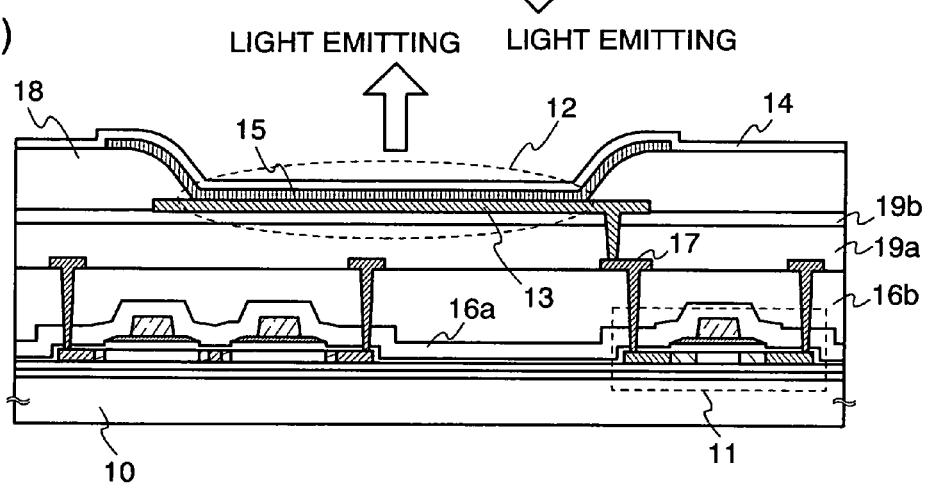
Figure 11C:
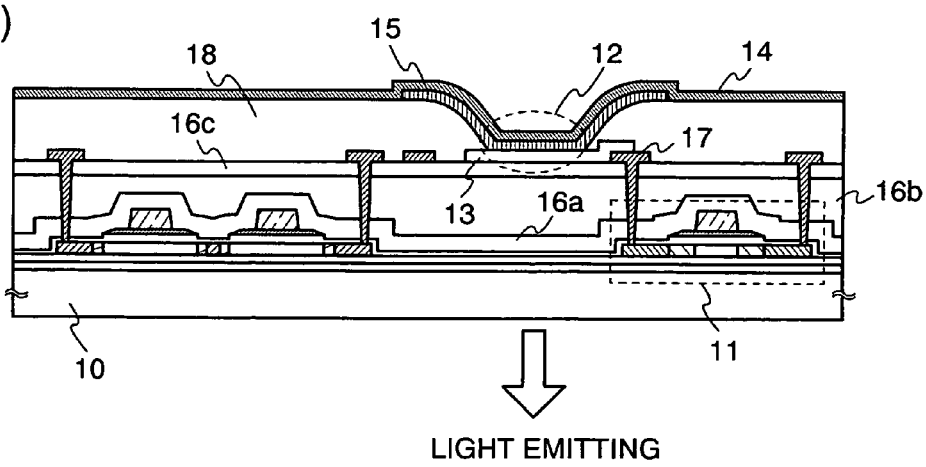

The first interlayer insulating film 16 may be multilayer as shown in FIGS. 11(A) and 11(C), or a single layer. Reference numeral 16a is made with an inorganic substance such as silicon oxide or a silicon nitride. Reference numeral 16b is made with acrylic or siloxane (which is a compound that has a skeleton structure formed by a silicon (Si) and oxygen (O) bond and includes hydrogen or an alkyl group as its substituent), or a substance with a self-planarizing property which can be formed by a coating method, such as a silicon oxide. Reference numeral 16c is made with a silicon nitride film containing argon (Ar). The substances making up each layer are not especially limited. Therefore, substances other than the above may be employed. Alternatively, a layer made with a substance other than those may be used in combination. Accordingly, the first interlayer insulating film 16 may be formed by using both an inorganic substance and an organic substance or using either an inorganic film or an organic film.

The edge portion of the partition layer 18 preferably has a shape in which the radius of curvature is continuously changed. This partition layer 18 is formed using acrylic, siloxane, resist, a silicon oxide or the like. Further, the partition layer 18 may be formed with one of or both an inorganic film and an organic film.

FIGS. 11(A) and 11(C) each shows a structure in which only the first interlayer insulating film 16 is provided between the transistor 11 and the light emitting element 12. Alternatively, as shown in FIG. 11(B), in addition to the first interlayer insulating film 16 (16a and 16b), a structure in which a second interlayer insulting film 19 (19a and 19b) is provided may be employed. In the light emitting device as shown in FIG. 11(B), the first electrode 13 passes through the second interlayer insulating film 19 to be connected to the wiring 17.

The second interlayer insulating film 19 may be multilayer or a single layer, as well as the first interlayer insulating film 16. Reference numeral 19a is made with acrylic, siloxane, or a substance having a self-planarizing property which can be formed by a coating method, such as a silicon oxide. Reference numeral 19b is made with a silicon nitride film containing argon (Ar). The substances making up each layer are not especially limited. Therefore, substances other than the above may be employed. Alternatively, a layer made with a substance other than those may be used in combination. Accordingly, the second interlayer insulating film 19 may be formed using both an inorganic substance and an organic substance or using either an inorganic film or an organic film.

When the first electrode and the second electrode each is formed using a substance having a light-transmitting property in the light emitting element 12, light-emission can be extracted through both the first electrode 13 side and the second electrode 14 side, as shown in the outline arrows in FIG. 11(A). When only the second electrode 14 is made with a substance having a light-transmitting property, light-emission can be extracted only from the second electrode 14 side, as shown in the outline arrow of FIG. 11(B). In this case, the first electrode 13 is preferably made with a substance with high reflectance, or a film (reflective film) made with a substance with high reflectance is preferably provided under the first electrode 13. When only the first electrode 13 is made with a substance having a light-transmitting property, light-emission can be extracted only from the first electrode 13 side, as shown in the outline arrow of FIG. 11(C). In this case, the second electrode 14 is preferably made using a substance having high reflectance, or a reflective film is preferably provided over the second electrode 14.

Moreover, the light emitting element 12 may be formed by stacking a layer 15, so that it can operate in applying voltage thereto such that an electric potential of the second electrode 14 is higher than that of the first electrode 13. Alternatively, it may be formed by stacking the layer 15, so that it can operate in applying voltage thereto such that an electric potential of the second electrode 14 is lower than that of the first electrode 13. In the former case, the transistor 11 is an N-channel transistor. In the latter case, the transistor 11 is a P-channel transistor.

Figure 12:
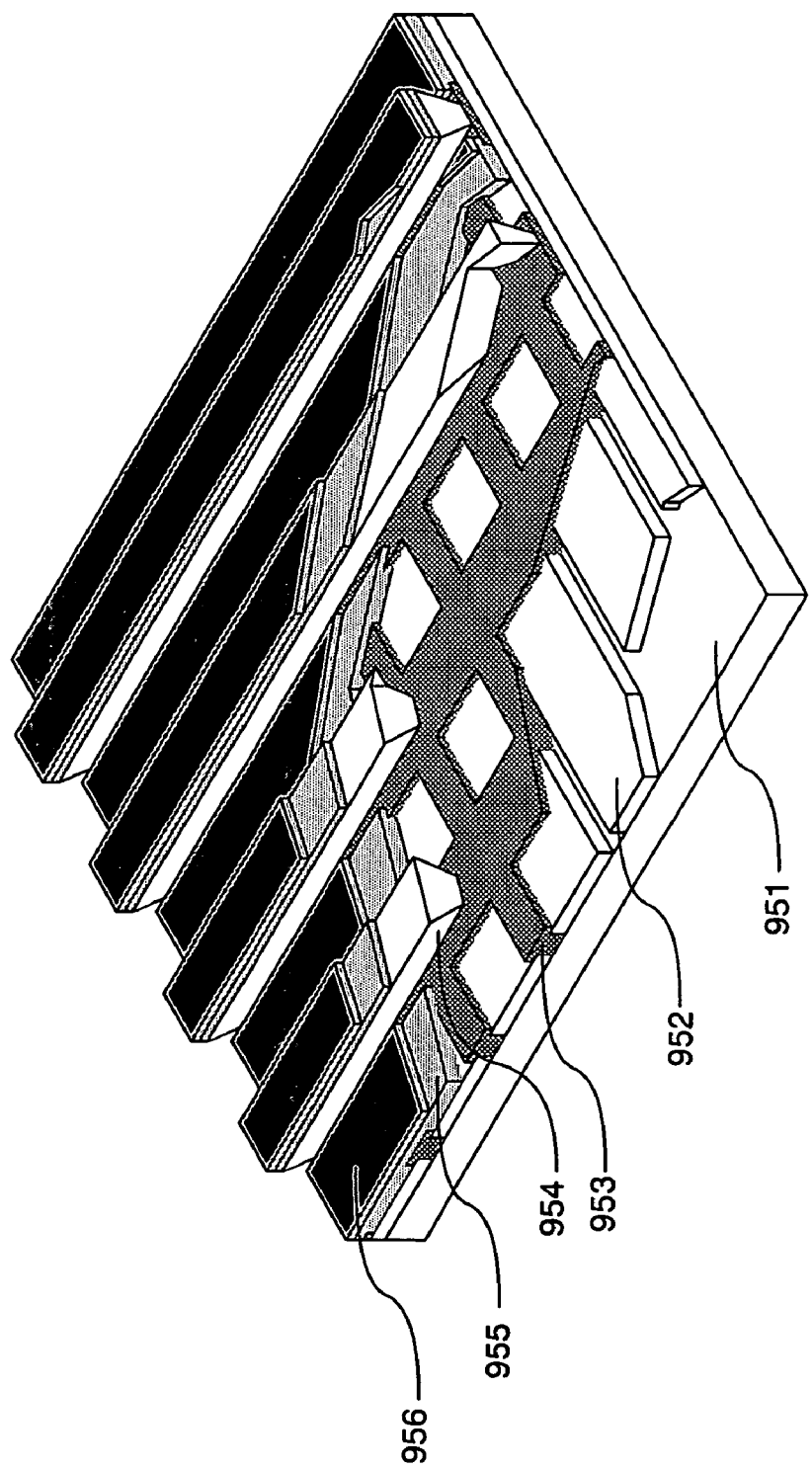
FIG. 12 is a diagram showing one mode of a light emitting device of the present invention.

As mentioned above, an active type light emitting device which controls the driving of the light emitting element using a transistor has been described in the present embodiment mode. In addition, a passive type light emitting device which drives a light emitting element without especially providing a driving element such as a transistor may be employed. FIG. 12 shows a perspective view of a passive type light emitting device which is manufactured by applying the present invention. In FIG. 12, a layer 955 in which a layer containing a light emitting substance, an electron generating layer and a hole generating layer are subsequently stacked, is provided between an electrode 952 and an electrode 956 over a substrate 951. An edge portion of the electrode 952 is covered with an insulating layer 953. A partition layer 954 is provided over the insulating layer 953. The sidewalls of the partition layer 954 are aslope such that a distance between the sidewall and the other sidewall is gradually narrowed toward the surface of the substrate. That is, a cross section in a short side of the partition layer 954 is a trapezoidal shape, and a lower side (the side faces the same direction as the plane direction of the insulating layer 953, and is in contact with the insulating layer 953) is shorter than an upper side (the side faces the same direction as the plane direction of the insulating layer 953, and is not in contact with the insulating layer 953). By providing the partition layer 954 in this manner, defects of the light emitting element due to static charge and the like can be prevented. In addition, in a passive light emitting device, by including the light emitting element of the present invention, which operates at low driving voltage, it can be driven at low power consumption.

Embodiment Mode 5

The light emitting device using a light emitting element of the present invention as a pixel, operates to display favorably with few defective displays due to defective operation of a light emitting element. Therefore, electronic equipment which has few false recognitions or the like of display image due to defective display can be obtained, by applying such a light emitting device to a display portion. Further, the light emitting device using the light emitting element of the present invention as a light source can light favorably with few defectives due to defective operation of a light emitting element. Therefore, by using such a light emitting device as a lighting portion of a back light or the like, and by mounting a light emitting device of the present invention in this way, defective operations such that dark portions are locally formed due to defectives of the light emitting element can be reduced, and thus, preferable display can be carried out.

One embodiment of electronic equipment mounting a light emitting device, to which the present invention is applied, is illustrated in FIG. 13.

Figure 13A:
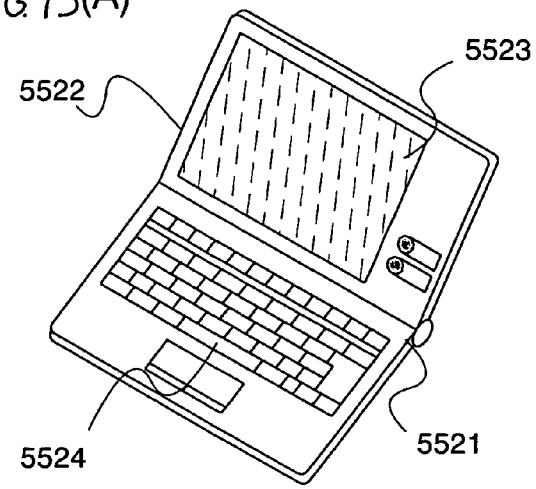
FIGS. 13(A)-13(C) are diagrams showing one mode of electronic equipment to which the present invention is applied.
Figure 14:
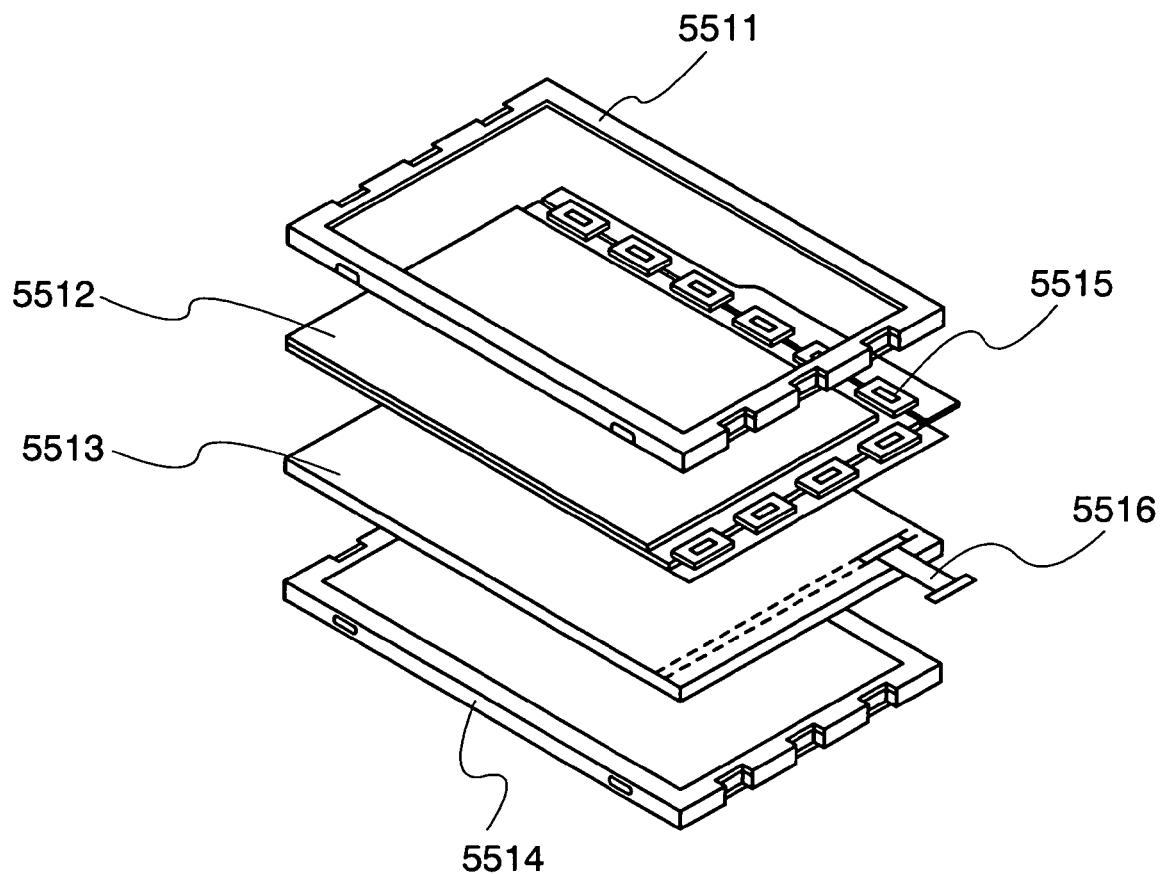
FIG. 14 is a diagram showing a lighting device to which the present invention is applied.

FIG. 13(A) is a personal computer, which is manufactured by applying the present invention, is formed by including a main body 5521, a casing 5522, a display portion 5523, a keyboard 5524 and the like. The personal computer can be completed by incorporating a light emitting device in which a light emitting element of the present invention shown in FIG. 7 is used as a pixel in the display portion. In addition, the personal computer can be completed by incorporating a light emitting device in which a light emitting element of the present invention is used as a light source, in the back light. Concretely, the personal computer using the light emitting element of the present invention as a light source can be completed by incorporating a casing 5511 and a casing 5514 to a liquid crystal device 5512, and a light emitting device 5513 provided with at least one light emitting element of the present invention, in the display portion of the personal computer, as shown in FIG. 14. An external input terminal 5515 is mounted in the liquid crystal device 5512, and an external input terminal 5516 is mounted in the light emitting device 5513. Note that, in the light emitting device, a plurality of the light emitting elements of the present invention may be arranged or one light emitting element may be provided so as to cover the most portion of the substrate. As for the light emitting device 5513, there is no particular limitation on the emission color from the light emitting element, and it may be white color, red color, blue color, green color, or the like.

Figure 13B:
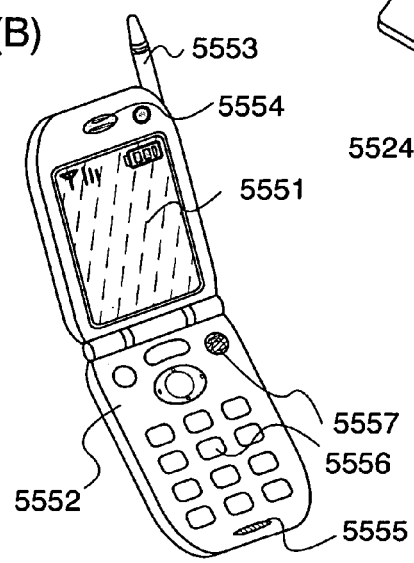

FIG. 13(B) is a telephone which is manufactured by applying the present invention, and a main body 5552 includes a display portion 5551, an audio output portion 5554, an audio input portion 5555, operation switches 5556 and 5557, an antenna 5553 and the like. The telephone can be completed by incorporating a light emitting device including a light emitting element of the present invention in the display portion.

Figure 13C:
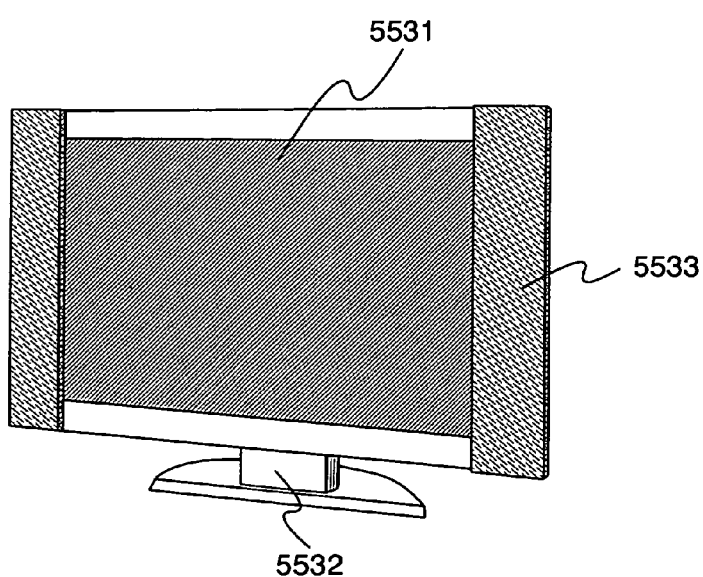

FIG. 13(C) is a television image receptor which is manufactured by applying the present invention and formed by including a display portion 5531, a casing 5532, speakers 5533 and the like. The television image receptor can be completed by incorporating a light emitting device in which a light emitting element of the present invention is included in the display portion.

As the above, the light emitting device of the present invention is very suitable for a display portion of each of electronic equipment. Note that electronic equipment is not limited to those mentioned in the present embodiment mode, and it may be a navigation device or other electronic equipment.

Embodiment 1

A synthesis method of 5,8-bis[2-(3-fluorophenyl)ethenyl]-6,7-dihydrodibenzo[b,j]-1,10-phenanthroline which can be represented by a structural formula (2) and can be used for carrying out the present invention will be shown.

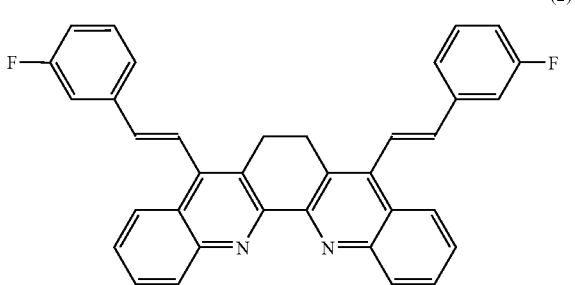

(2)

[Step 1]

A compound, which is represented by a structural formula (3), of 5,8-dimethyl-6,7-dihydrodibenzo[b,j]-1,10-phenanthroline is synthesized.

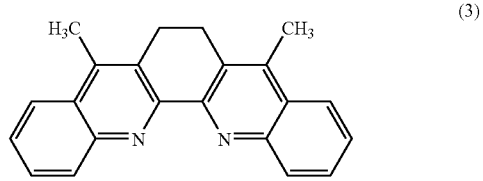

(3)

The catalyst quantity (approximately 5 mol %) of p-toluenesulfonic acid monohydrate was added to an ethyleneglycol monoethyl ether (100 mL) solution of 2'-aminoacetophenon (24.6 g, 182 mmol) and 1,2-cyclohexadione (10.2 g, 91 mmol), and reflux was performed by heating for 48 hours (synthesis scheme (a-1)). The reaction solution was cooled to a room temperature, and a precipitated solid was filtered. The filtrate was recrystallized with tetrahydrofran to obtain a compound at a yield of 38%. By measurement of the obtained compound by NMR, it could be confirmed that it was 5,8-dimethyl-6,7-dihydrodibenzo[b,j]-1,10-phenanthroline.

NMR data of the obtained compound is shown below.

$^1$H NMR (300 MHz, CDCl$_3$) δ8.43 (d,2H, J=8.4 Hz), 7.97 (d,2H, J=8.0 Hz), 7.66 (dd, 2H, J=8.4, 15 Hz), 7.53 (dd, 2H, J=8.0, 15 Hz), 3.19 (s,4H), 2.67 (s,6H).

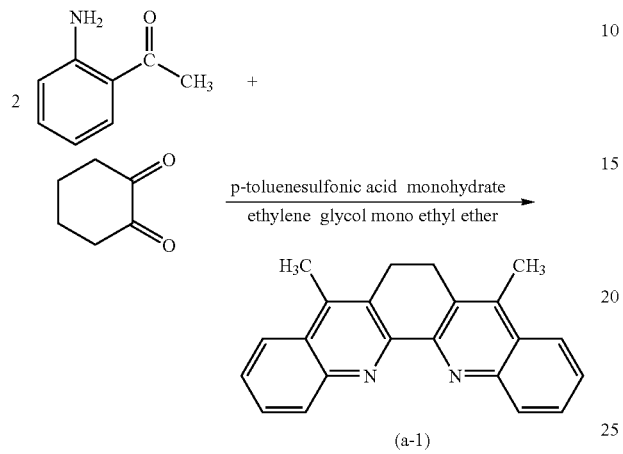

(a-1)

[Step 2]

Hereinafter, a synthesis method of a compound represented by the structural formula (2), 5,8-bis[2-(3-fluorophenyl)ethenyl]-6,7-dihydrodibenzo[b,j]-1,10-phenanthroline will be shown.

An acetic anhydride (approximately 50 mL) solution of a compound represented by the structural formula (3), 5,8-dimethyl-6,7-dihydrodibenzo[b,j]-1,10-phenanthroline (7.7 g, 25 mmol), and 3-fluorobenzaldehyde (9.2 g, 74 mmol) was refluxed by heating for 36 hours (synthesis scheme (a-2)). The reaction solution was made basic with a 10% sodium hydroxide solution, and then, extraction with ethyl acetate was performed. The organic layer was dried with magnesium sulfate, filtered, and condensed, and the residue was twice purified by alumina chromatography (developing solvent: methylene chloride) to obtain a compound. Then, the obtained compound was further purified by liquid preparative chromatography (manufactured by Japan Analytical Industry Co., Ltd., recycling preparative HPLC, LC-908W-C60, developing solvent: chloroform), and then, recrystallization was performed with a hexane/ethyl acetate mixed solution to obtain a compound at yield of 15%. By measurement of the obtained compound by NMR, it could be confirmed that it was 5,8-bis[2-(3-fluorophenyl)ethenyl]-6,7-dihydrodibenzo[b,j]-1,10-phenanthroline.

NMR data is shown below.

$^1$H NMR (300 MHz, CDCl$_3$) δ8.49 (d,2H, J=8.7 Hz), 6.08 (d, 2H, J=8.4 Hz), 7.26-7.80 (m, 12H), 67.07 (dd, 2H, J=7.2, 17.0 Hz), 6.83 (d,2H, J=17.0 Hz), 3.28 (s,4H).

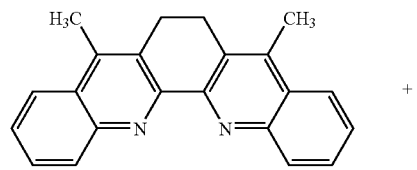

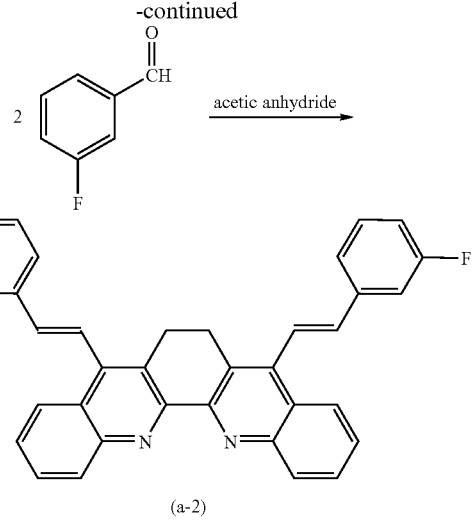

(a-2)

The invention claimed is:

1. A light emitting element comprising:
   between a first electrode and a second electrode, a first layer, a second layer, and a third layer,
   wherein the first layer includes a first substance having a hole mobility equal to or higher than $1 \times 10^{-6}$ cm$^2$/Vs, and a second substance showing an electron accepting property to the first substance,
   wherein the second layer includes a layer having a light emitting substance, and
   wherein the third layer includes a phenanthroline derivative represented by a general formula (1) and a third substance showing an electron donating property to the phenanthroline derivative

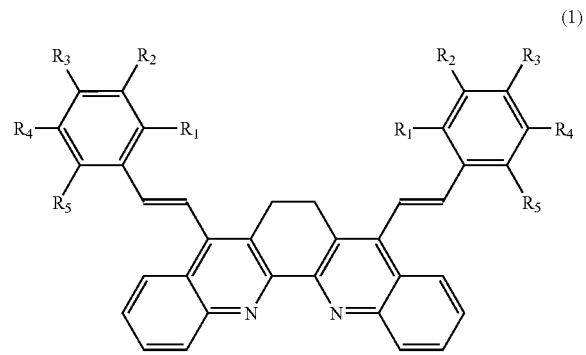

(1)

(wherein, R$^4$ represents a fluoro group, and R$^1$, R$^2$, R$^3$ and R$^5$ represent a hydrogen atom).

2. The light emitting element according to claim 1, wherein the second substance is at least one substance selected from a molybdenum oxide, a vanadium oxide, or a ruthenium oxide; and the third substance is at least one substance selected from an alkali metal oxide and an alkali earth metal oxide.

3. The light emitting element according to claim 1, wherein the first layer is in contact with the first electrode.

4. The light emitting element according to claim 1, wherein the second layer is interposed between the first layer and the third layer.

5. A light emitting element comprising:

between a first electrode and a second electrode, a first layer, a second layer, and a third layer, wherein the first layer includes a first substance having a hole mobility equal to or higher than $1\times10^{-6}$ cm$^2$/Vs, and a second substance showing an electron accepting property to the first substance, wherein the second layer includes a phenanthroline derivative represented by a general formula (1) and a third substance showing an electron donating property to the phenanthroline derivative, wherein the third layer includes a light emitting substance, wherein the first layer is provided more closely to the first electrode side than the second layer, wherein the third layer is provided more closely to the second electrode side than the second layer, and wherein the second layer and the third layer are connected so that electrons are injected from the second layer to the third layer when a voltage is applied so that electric potential of the first electrode is lower than that of the second electrode

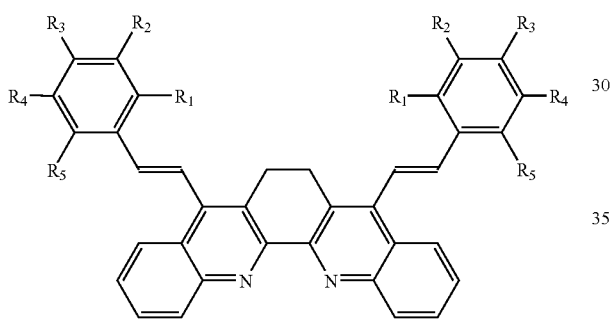

(1)

(wherein, R$^4$ represents a fluoro group, and R$^1$, R$^2$, R$^3$ and R$^5$ represent a hydrogen atom).

6. The light emitting element according to claim 5, wherein the first layer is in contact with the first electrode.

7. A light emitting element comprising:

between a first electrode and a second electrode, a first layer, a second layer, and a third layer, wherein the first layer includes a first substance having a hole mobility equal to or higher than $1\times10^{-6}$ cm$^2$/Vs, and a second substance showing an electron accepting property to the first substance, wherein the second layer includes a phenanthroline derivative represented by a general formula (1) and a third substance showing an electron donating property to the phenanthroline derivative, wherein the third layer includes an electron transporting layer, a light emitting layer, a hole transporting layer, and a hole generating layer, wherein the first layer is provided more closely to the first electrode side than the second layer, wherein the third layer is provided more closely to the second electrode side than the second layer, and wherein the second layer and the electron transporting layer are in contact with each other

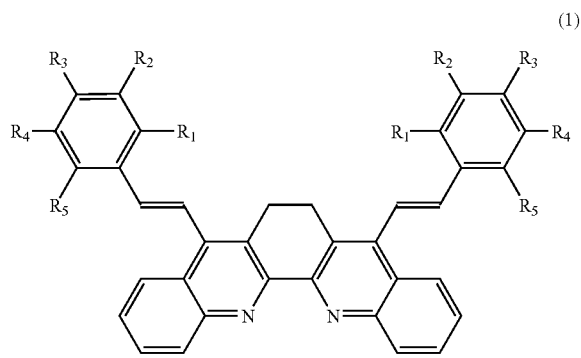

(1)

(wherein, R$^4$ represents fluoro group, and R$^1$, R$^2$, R$^3$ and R$^5$ represent a hydrogen atom).

8. The light emitting element according to claim 7, wherein the first layer is in contact with the first electrode.

9. The light emitting element according to any one of claims 1, 5 and 7, wherein the light emitting element is used as a pixel or a light source of a light emitting device.

10. The light emitting element according to claim 9, wherein the light emitting device is used as a display portion.

11. The light emitting element according to claim 10, wherein the light emitting device is at least one selected from a personal computer, a telephone, and a television image receptor.

12. The light emitting element according to claim 5 or claim 7, wherein the second substance is at least one substance selected from a molybdenum oxide, a vanadium oxide, or a ruthenium oxide; and the third substance is at least one substance selected from an alkali metal oxide and an alkali earth metal oxide.

13. The light emitting element according to any one of claims 1, 5, and 7, wherein the second substance is a molybdenum oxide.

14. A light emitting element comprising:

between a first electrode and a second electrode, a first layer, a second layer, and a third layer, wherein the first layer includes a first substance having a hole mobility equal to or higher than $1\times10^{-6}$ cm$^2$/Vs, and a second substance showing an electron accepting property to the first substance, wherein the second layer includes a layer having a light emitting substance, and wherein the third layer includes a phenanthroline derivative represented by a general formula (1) and a third substance showing an electron donating property to the phenanthroline derivative, wherein the third layer is in contact with an electron transporting layer,

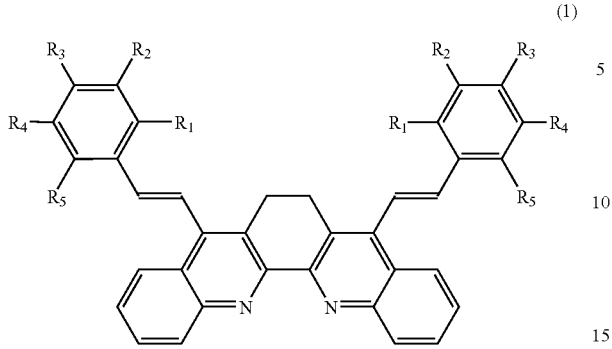

(wherein, $R^4$ represents a fluoro group, and $R^1$, $R^2$, $R^3$ and $R^5$ represent a hydrogen atom).

15. The light emitting element according to claim 14, wherein the second substance is at least one substance selected from a molybdenum oxide, a vanadium oxide, or a ruthenium oxide; and the third substance is at least one substance selected from an alkali metal oxide and an alkali earth metal oxide.

16. The light emitting element according to claim 14, wherein the light emitting element is used as a pixel or a light source of a light emitting device.

17. The light emitting element according to claim 14, wherein the second substance is a molybdenum oxide.

18. The light emitting element according to claim 14, wherein the first layer is in contact with the first electrode.

19. The light emitting element according to claim 14, wherein the second layer is interposed between the first layer and the third layer.

* * * * *